(12) United States Patent
Lee

(10) Patent No.: US 11,322,518 B2
(45) Date of Patent: May 3, 2022

(54) MEMORY DEVICE AND METHOD OF MANUFACTURING THE SAME

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/028,757

(22) Filed: Sep. 22, 2020

(65) Prior Publication Data

US 2021/0104539 A1 Apr. 8, 2021

Related U.S. Application Data

(63) Continuation-in-part of application No. 16/880,678, filed on May 21, 2020.

(30) Foreign Application Priority Data

Oct. 4, 2019 (KR) .......................... 10-2019-0123129
Aug. 18, 2020 (KR) .......................... 10-2020-0103398

(51) Int. Cl.
*H01L 27/11582* (2017.01)
*H01L 27/11556* (2017.01)
*H01L 23/522* (2006.01)
*H01L 21/768* (2006.01)
(Continued)

(52) U.S. Cl.
CPC .. *H01L 27/11582* (2013.01); *H01L 21/76802* (2013.01); *H01L 21/76829* (2013.01); *H01L 21/76843* (2013.01); *H01L 23/5226* (2013.01); *H01L 27/11519* (2013.01); *H01L 27/11556* (2013.01); *H01L 27/11565* (2013.01)

(58) Field of Classification Search
CPC ......... H01L 27/11582; H01L 21/76802; H01L 21/76829; H01L 21/76843; H01L 23/5226; H01L 27/11519; H01L 27/11556; H01L 27/11565; H01L 21/76834; H01L 27/11548; H01L 27/11575; H01L 21/76816

See application file for complete search history.

(56) References Cited

U.S. PATENT DOCUMENTS 9,437,606 B2    9/2016  Makala et al.
9,449,987 B1 *  9/2016  Miyata .............. H01L 27/11565
11,075,084 B2 * 7/2021  Shen ....................... C23C 16/24
(Continued)

FOREIGN PATENT DOCUMENTS

KR          101589275 B1    1/2016

*Primary Examiner* — Karen Kusumakar
(74) *Attorney, Agent, or Firm* — William Park & Associates Ltd.

(57) ABSTRACT

A memory device and a method of manufacturing the memory device includes a stacked structure having a cell region and a slimming region therein and formed by alternately stacking insulating layers and conductive layers, vertical channel structures formed to pass through the stacked structure in the cell region, support structures formed to pass through the stacked structure in the slimming region, and having different heights depending on a stacked height of the slimming region, each of the support structures having the vertical channel structure, an etching prevention layer formed over the stacked structure and including carbon, and contact plugs formed to pass through the etching prevention layer and coupled to the conductive layers.

20 Claims, 35 Drawing Sheets

(51) Int. Cl.
*H01L 27/11565* (2017.01)
*H01L 27/11519* (2017.01)

(56) References Cited

U.S. PATENT DOCUMENTS

2018/0342531 A1 11/2018 Susuki et al.
2020/0127006 A1 4/2020 Otsu et al.

* cited by examiner

MEMORY DEVICE AND METHOD OF MANUFACTURING THE SAME

CROSS-REFERENCE TO RELATED APPLICATION

The present application claims priority under 35 U.S.C. 119(a) to Korean patent application number 10-2020-0103398, filed on Aug. 18, 2020, and this application is a continuation-in-part of U.S. patent application Ser. No. 16/880,678 filed on May 21, 2020, which claims priority to Korean patent application number 10-2019-0123129 filed on Oct. 4, 2019, in the Korean Intellectual Property Office. The disclosure of the above-listed application is hereby incorporated by reference herein in their entirety.

BACKGROUND

1. Technical Field

Various embodiments of the present disclosure generally relate to a memory device and a method of manufacturing the memory device, and more particularly, to a memory device including memory cells stacked in a direction perpendicular to a substrate, and a method of manufacturing the memory device.

2. Related Art

Memory devices may include volatile memory for which stored data is lost when power is interrupted. Memory devices may also include non-volatile memory for which stored data is retained even when power is interrupted.

With the growing popularity of portable electronic devices such as cellular phones and notebooks, non-volatile memory devices with increased capacity and degree of integration are in demand.

The potential for further improving the degree of integration of two-dimensional non-volatile memory devices including memory cells formed on a substrate in a single layer is limited. Therefore, three-dimensional (3D) non-volatile memory devices including memory cells stacked in a vertical direction on a substrate have been proposed.

SUMMARY

In accordance with an embodiment of the present disclosure is a memory device. The memory device includes a stacked structure having a cell region and a slimming region therein and formed by alternately stacking insulating layers and conductive layers, vertical channel structures formed to pass through the stacked structure in the cell region, support structures formed to pass through the stacked structure in the slimming region, and having different heights depending on a stacked height of the slimming region, each of the support structures having the vertical channel structure, an etching prevention layer formed over the stacked structure and comprising carbon, and contact plugs formed to pass through the etching prevention layer and coupled to the conductive layers.

In accordance with an embodiment of the present disclosure is a method of manufacturing a memory device. The method includes alternately stacking insulating layers and conductive layers in a cell region and a slimming region, and forming a stacked structure having a stepped structure in the slimming region, forming an etching prevention layer comprising carbon along an upper surface of the stacked structure, forming an interlayer insulating layer over the etching prevention layer, performing a first etching process of forming contact holes for exposing portions of the etching prevention layer in the cell region and the slimming region of the interlayer insulating layer, performing a second etching process of removing the etching prevention layer exposed through the contact holes, and forming contact plugs in the contact holes.

In accordance with an embodiment of the present disclosure is a method of manufacturing a memory device. The memory device includes forming a stacked structure formed by alternately stacking first material layers and second material layers, successively forming an etching prevention layer and an interlayer insulating layer over the stacked structure, forming a slit region vertically passing through the interlayer insulating layer, the etching prevention layer, the stacked structure, performing an etching process of removing the second material layers exposed through the slit region, forming third material layers in regions from which the second material layers are removed, and forming a fourth material layer in the slit region. The etching prevention layer may be formed of material having an etch selectivity different from an etch selectivity of the second material layer.

DETAILED DESCRIPTION

Figure 1:
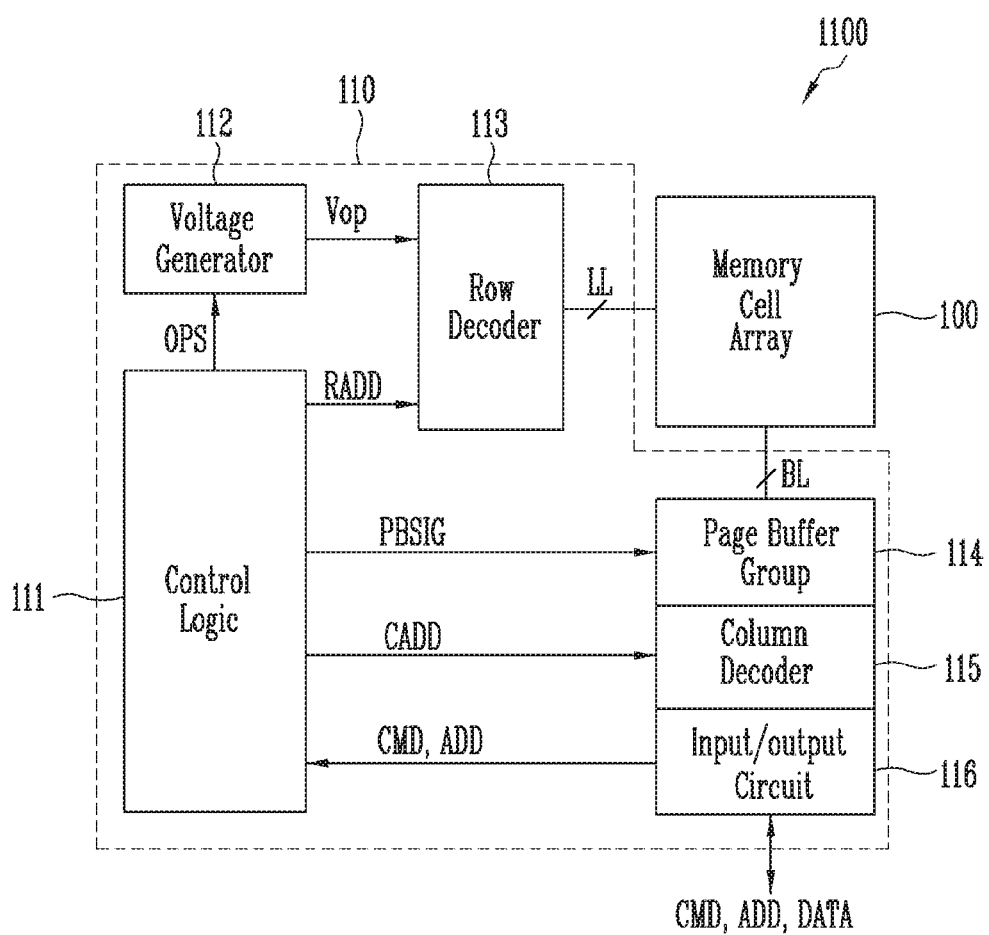
FIG. 1 is a diagram illustrating a memory device in accordance with an embodiment of the present disclosure.

FIG. 1 is a diagram illustrating a memory device 1100 in accordance with an embodiment of the present disclosure.

Referring to FIG. 1, the memory device 1100 may include a memory cell array 100 configured to store data, and peripheral circuits 110 configured to perform a program operation, a read operation, or an erase operation of the memory cell array 100.

The memory cell array 100 may include a plurality of memory blocks each including non-volatile memory cells. Local lines LL may be coupled to each of the memory blocks. Bit lines BL may be coupled in common to each of the memory blocks.

The peripheral circuits 110 may include control logic 111, a voltage generator 112, a row decoder 113, a page buffer group 114, a column decoder 115, and an input/output circuit 116.

The control logic 111 may control the voltage generator 112, the row decoder 113, the page buffer group 114, the column decoder 115, and the input/output circuit 116 in response to a command CMD and an address ADD. For example, the control logic 111 may output an operating signal OPS and a page buffer control signal PBSIG in response to a command CMD, and output a row address RADD and a column address CADD in response to an address ADD. The control logic 111 may be implemented as hardware, software, or a combination of hardware and software. For example, the control logic 111 may be a control logic circuit operating in accordance with an algorithm and/or a processor executing control logic code.

The voltage generator 112 may generate operating voltages Vop needed for a program operation, a read operation, or an erase operation, in response to an operating signal OPS. For example, the voltage generator 112 may generate and output operating voltages Vop such as a program voltage, a read voltage, an erase voltage, and a pass voltage.

The row decoder 113 may transmit operating voltages Vop to a selected memory block through the local lines LL in response to a row address RADD.

The page buffer group 114 may include a plurality of page buffers coupled with the bit lines BL. The page buffer group 114 may temporarily store data in response to a page buffer control signal PBSIG during a program operation or a read operation.

The column decoder 115 may transmit data between the page buffer group 114 and the input/output circuit 116 in response to a column address CADD.

The input/output circuit 116 may receive a command CMD and an address ADDR from an external device and transmit the command CMD and the address ADDR to the control logic 111. The input output circuit 116 may transmit data DATA received from the external device to the column decoder 115 during a program operation, and output data DATA received from the column decoder 115 to the external device during a read operation.

Figure 2:
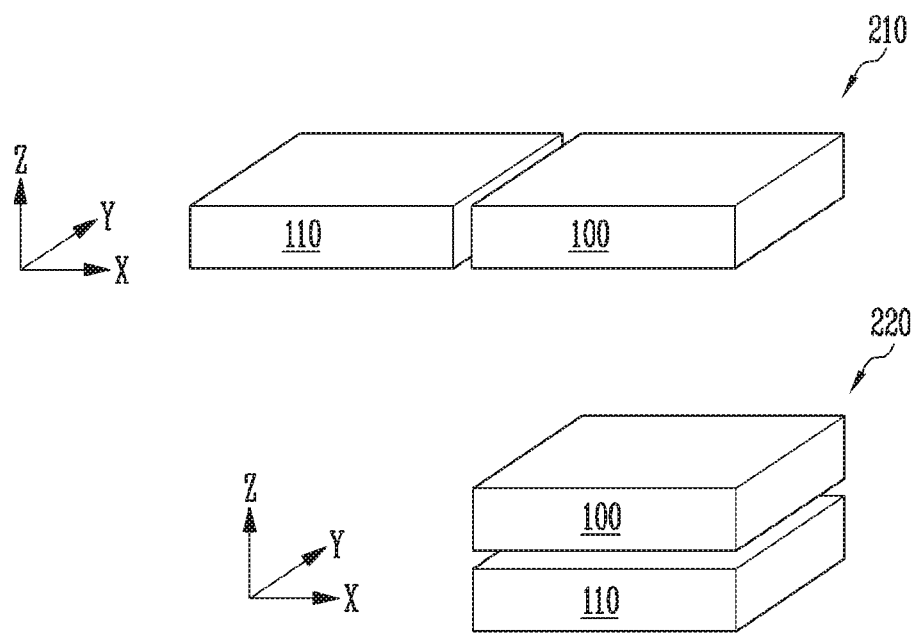
FIG. 2 is a diagram for describing arrangement between a memory cell array and peripheral circuits in accordance with an embodiment.

FIG. 2 is a diagram for describing arrangement between the memory cell array 100 and the peripheral circuits 110 in accordance with an embodiment.

Referring to FIG. 2, the memory cell array 100 and the peripheral circuits 110 described with reference to FIG. 1 may be arranged in various structures. For example, in the case where the substrate is disposed in parallel with an X-Y direction, the memory cell array 100 and the peripheral circuits 110 may be disposed in parallel with each other in the X-Y direction (as indicated by reference numeral 210). Alternatively, the memory cell array 100 may be disposed over the peripheral circuits 110 in a direction (a Z direction) perpendicular to the substrate (as indicated by reference numeral 220). In other words, the peripheral circuits 110 may be disposed between the substrate and the memory cell array 100.

Figure 3:
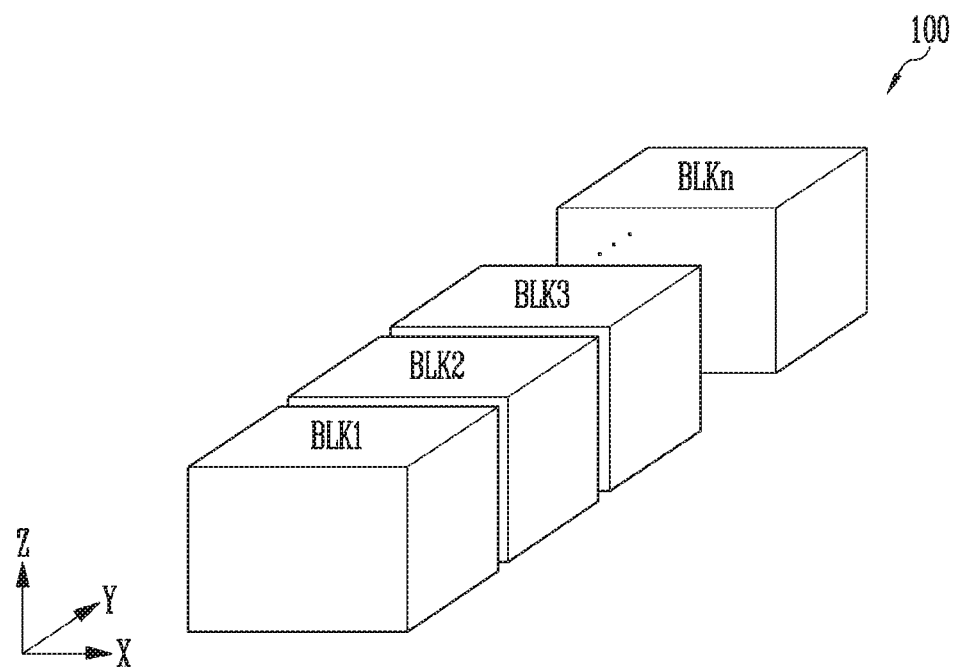
FIG. 3 is a diagram illustrating a memory cell array including memory blocks each having a three-dimensional structure in accordance with an embodiment.

FIG. 3 is a diagram illustrating a memory cell array including memory blocks each having a three-dimensional structure in accordance with an embodiment.

Referring to FIG. 3, in the case where the memory cell array 100 includes memory blocks BLK1 to BLKn each having a three-dimensional structure, the memory blocks BLK1 to BLKn may be arranged in the Y direction. The Y direction may be a direction in which the bit lines BL of FIG. 1 extends.

Although FIG. 3 illustrates that the memory cell array 100 includes a single plane, the memory cell array 100 may include a plurality of planes. The plurality of planes may be arranged in the X direction. Memory blocks included in each plane may be arranged in the Y direction in the corresponding plane.

Figure 4:
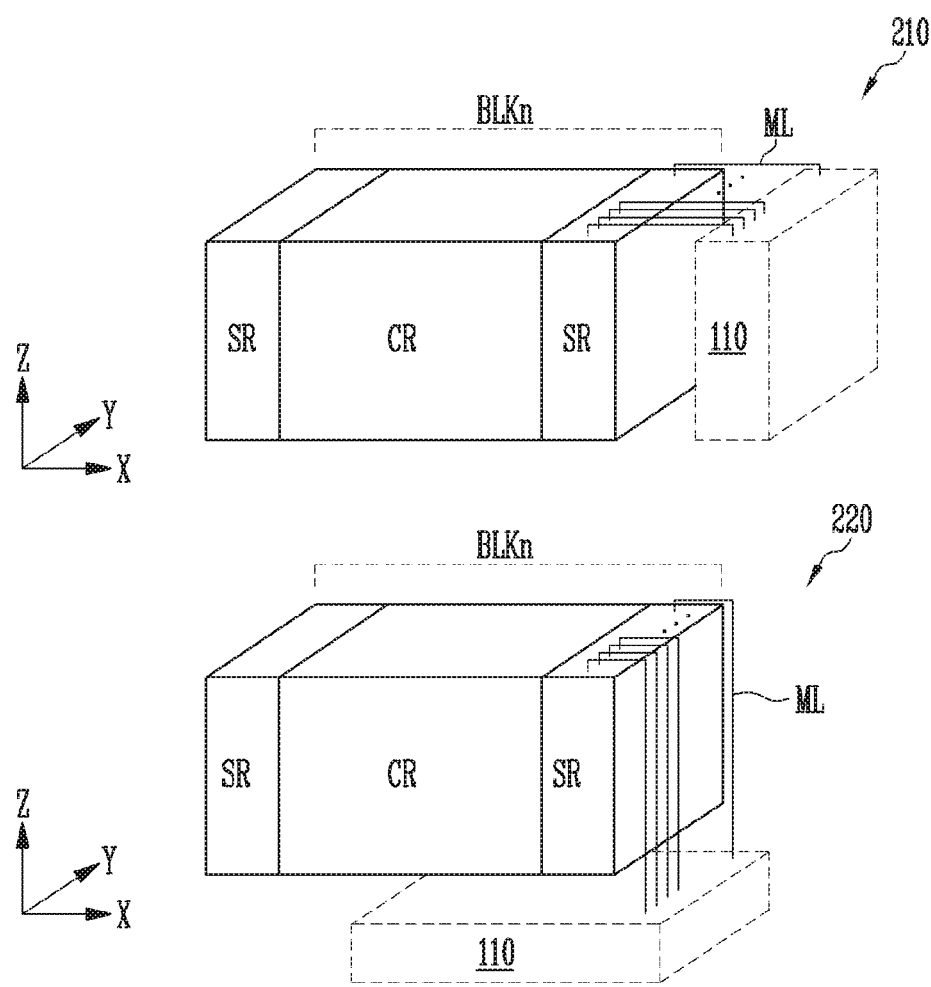
FIG. 4 is a diagram for describing the configuration of a memory block and connection relationship between the memory block and peripheral circuits in accordance with an embodiment.

FIG. 4 is a diagram for describing the configuration of a memory block BLKn and connection relationship between the memory block BLKn and the peripheral circuits 110 in accordance with an embodiment.

The plurality of memory blocks BLK1 to BLKn described with reference to FIG. 3 may have the same configuration. FIG. 4 illustrates any one memory block BLKn as a representative example of the plurality of memory blocks BLK1 to BLKn.

Referring to FIG. 4, the memory block BLKn having a three-dimensional structure may include a cell region CR including memory cells, and a slimming region SR provided to electrically couple the peripheral circuits 110 with the cell region CR. For example, the cell region CR may include a plurality of vertical strings obtained by stacking memory cells and select transistors. The slimming region SR may include ends of a plurality of gate lines coupled to the memory cells and the select transistors. For example, in the slimming region SR, the gate lines may be stacked in a stepped structure in which a gate line disposed at a relatively lower position extends a length longer than that of a gate line disposed at a relatively upper position. Exposed portions of the gate lines having the stepped structure may be coupled to the peripheral circuits 110 through contact plugs.

In the case where, as indicated by reference numeral 210, the peripheral circuits 110 and the memory block BLKn are disposed in the horizontal direction (the X direction), a plurality of lines ML for electrically coupling the slimming region SR with the peripheral circuits 110 may be formed. For example, in the structure indicated by reference numeral 210, the plurality of lines ML may extend in the X direction and be disposed at positions spaced apart from each other in the Y direction.

In the case where, as indicated by reference numeral 220, the peripheral circuits 110 are disposed under the memory block BLKn (in the Y direction), a plurality of lines ML for electrically coupling the slimming region SR with the peripheral circuits 110 may extend in the Z direction and be disposed at positions spaced apart from each other in the Y direction.

Figure 5:
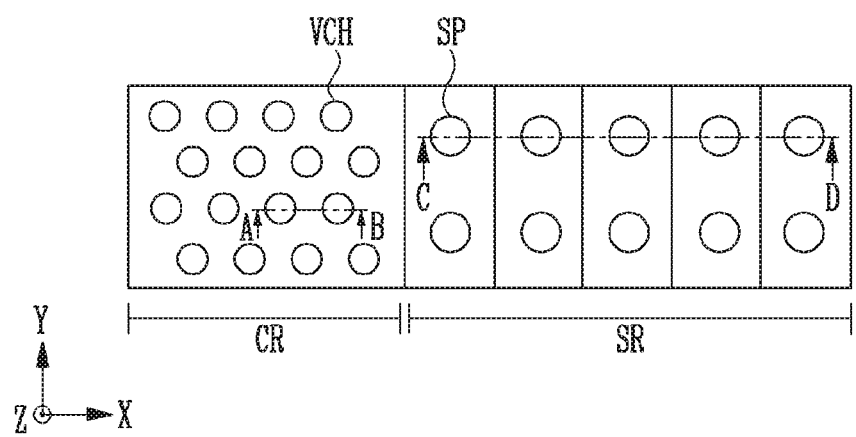
FIG. 5 is a diagram illustrating a layout of a cell region and a slimming region in accordance with an embodiment.

FIG. 5 is a diagram illustrating a layout of the cell region CR and the slimming region SR in accordance with an embodiment.

Referring to FIG. 5, a plurality of vertical channel structures VCH may be formed in the cell region CR. A plurality of support structures SP may be formed in the slimming region SR. The vertical channel structures VCH may vertically pass through a structure stacked in the Z direction in the cell region CR and include a plurality of memory cells. The support structures SP may support the stacked structure formed in the memory block.

The support structures SP may vertically pass through a structure stacked in the Z direction in the slimming region SR and have the same structure as that of the vertical channel structures VCH.

In an embodiment of the present disclosure, because the support structures SP are formed simultaneously with formation of the vertical channel structures VCH, separate manufacturing steps for forming the support structures SP are not needed. Therefore, in the memory device in accordance with an embodiment of the present disclosure, the support structures SP may mitigate or prevent the memory block from being inclined. Because the support structures SP are formed simultaneously with formation of the vertical channel structures VCH, the manufacturing process may be facilitated.

The numbers of vertical channel structures VCH and support structures SP are not limited to those illustrated in FIG. 5, and may be changed depending on the size of the memory block or the number of stacked layers included in the stacked structure.

In the following embodiments, a method of manufacturing the vertical channel structures VCH and the structure of the cell region CR will be described with reference to a cross-section taken along line A-B, and a method of manufacturing the support structures SP and the structure of the slimming region SR will be described with reference to a cross-section taken along line C-D.

FIGS. 6 to 25 are diagrams for describing a method of manufacturing a memory device in accordance with a first embodiment of the present disclosure.

Figure 6:
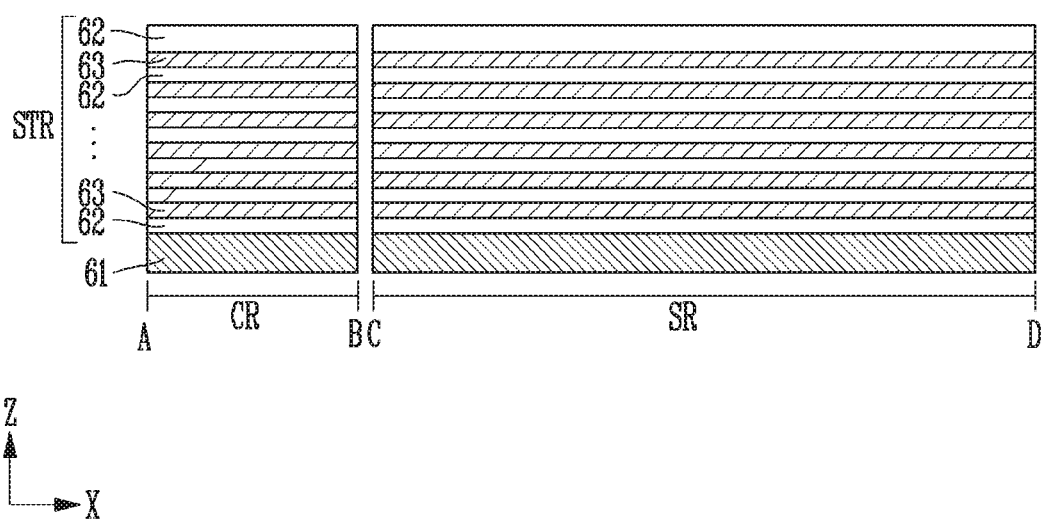
FIGS. 6 to 25 are diagrams for describing a method of manufacturing a memory device in accordance with a first embodiment of the present disclosure.

Referring to FIG. 6, in the first embodiment, there is illustrated a single stack structure in which one stacked structure STR is formed on a base 61.

The stacked structure STR may be formed on the base 61. The base 61 may be a semiconductor substrate, and include a lower structure such as a peripheral circuit and a source structure.

The stacked structure STR may include first material layers 62 and second material layers 63 that are alternately stacked. The first material layers 62 may be provided to insulate stacked gate electrodes from each other. The second material layers 63 may be provided to form the gate electrodes such as memory cells and select transistors. The second material layers 63 may be made of material having a high etch selectivity with respect to the first material layers 62. For example, the second material layers 63 may be sacrificial layers including nitride or the like, and the first material layers 62 may be insulating layers including oxide or the like. A second material layer 63 may be formed on the uppermost end of the stacked structure STR.

Figure 7:
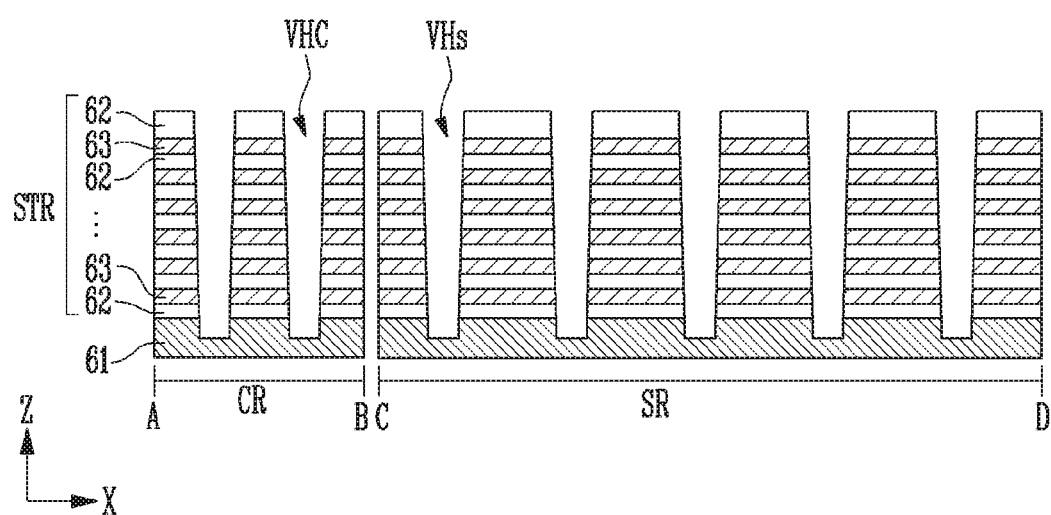

Referring to FIG. 7, vertical holes VHc and VHs that vertically pass through the stacked structure STR may be formed. For example, in the cell region CR and the slimming region SR, a mask pattern (not illustrated) having a plurality of openings may be formed on the second material layer 63 formed on the uppermost end of the stacked structure STR. Portions of the stacked structure STR that are exposed through the openings may be etched. The etch process may be performed until the base 61 is exposed.

Through a subsequent process, vertical channel structures (VCH of FIG. 5) may be formed in the vertical holes VHc formed in the cell region CR, and support structures (SP of FIG. 5) may be formed in the vertical holes VHs formed in the slimming region SR. Therefore, as illustrated in FIG. 5, the vertical holes VHc formed in the cell region CR may be arranged in a zigzag pattern, and the vertical holes VHs formed in the slimming region SR may be arranged in the form of a matrix pattern along the X direction and the Y direction. However, the vertical holes VHc and VHs may be arranged in various patterns as well as the patterns illustrated in FIG. 5, and the arrangement patterns and the patterns of the vertical holes VHc and VHs in accordance with an embodiment are not limited to those illustrated in FIG. 5.

Figure 8:
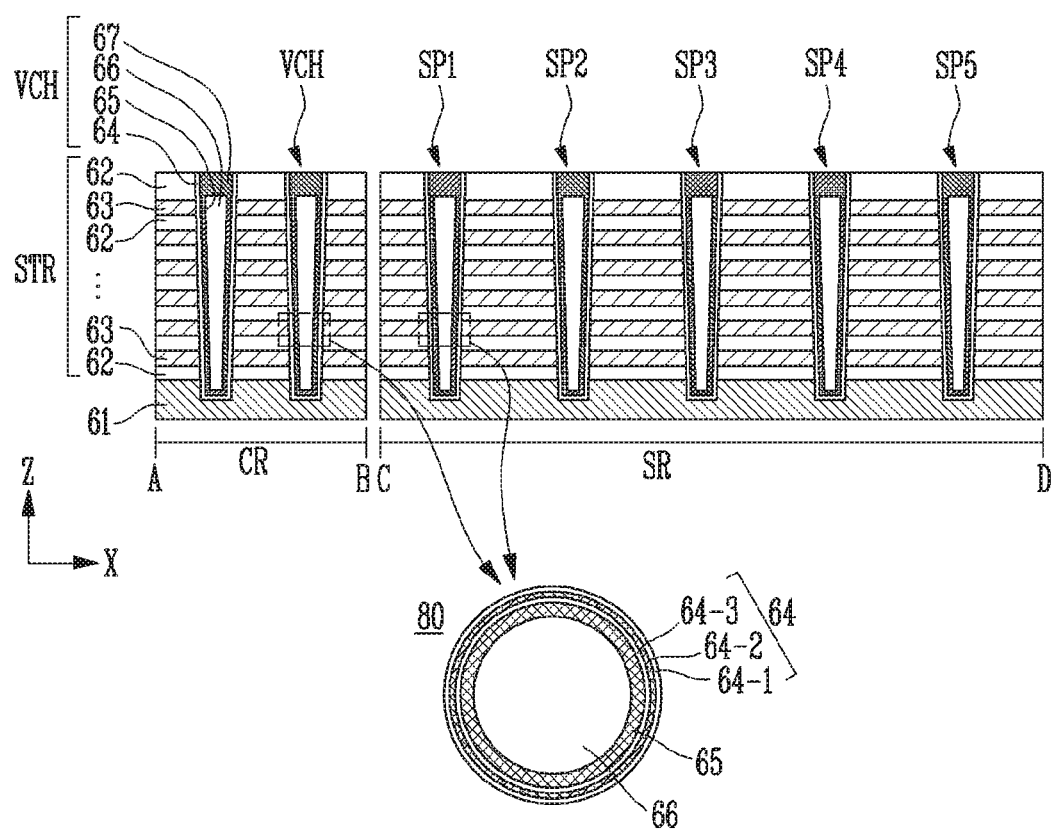

Referring to FIG. 8, the vertical channel structures VCH may be formed in the vertical holes VHc of the cell region CR. The support structures SP1 to SP5 may be formed in the vertical holes VHs of the slimming region SR. The support structures SP1 to SP5 may have the same structure as that of the vertical channel structures VCH and be formed simultaneously with formation of the vertical channel structures VCH.

The vertical channel structures VCH formed in the cell region CR and the support structures SP1 to SP5 each may include a memory layer 64, a channel layer 65, a vertical insulating layer 66, and a capping layer 67 that are formed in the order of proximity to an inner surface of the vertical hole VHc, VHs. The memory layer 64 may be formed in a hollow cylindrical shape along the inner surface of the vertical hole VHc, VHs. The channel layer 65 may be formed in a hollow cylindrical shape along an inner surface of the memory layer 64. The vertical insulating layer 66 may be provided in the form of a cylinder with which space defined by the channel layer 65 is filled. Although not illustrated, in various embodiments, the channel layer 65 may be provided in the form of a cylinder. In this case, the vertical insulating layer 66 may not be formed. The capping layer 67 may be formed on the channel layer 65 and the vertical insulating layer 66 and be enclosed by the memory layer 64.

In the cell region CR, portions of each vertical channel structure VCH that are adjacent to the second material layers 63 may be used as memory cells. The support structures SP1 to SP5 formed in the slimming region SR may be used to support the stacked structure STR.

The structure of the vertical channel structures VCH and the support structures SP1 to SP5 are described in more detail with reference to diagramed view 80. The memory layer 64 may include a blocking layer 64-1, a trap layer 64-2, and a tunnel insulating layer 64-3 that are formed in the order of proximity to the vertical hole VHc, VHs.

The blocking layer 64-1 may be formed of an insulating layer including oxide or the like. The trap layer 64-2 may be made of material, e.g., poly-silicon, nitride, variable resistance material, or phase-change material, capable of trapping charges. The tunnel insulting layer 64-3 may be formed of an insulating layer including oxide or the like. The channel layer 65 may be formed of poly-silicon. The vertical insulting layer 66 may be formed of an insulating layer including oxide or the like. Data may be stored in the vertical channel structures VCH formed in the cell region CR. In detail, data may be stored in the trap layers 64-2 of the vertical channel structure VCH.

Figure 9:
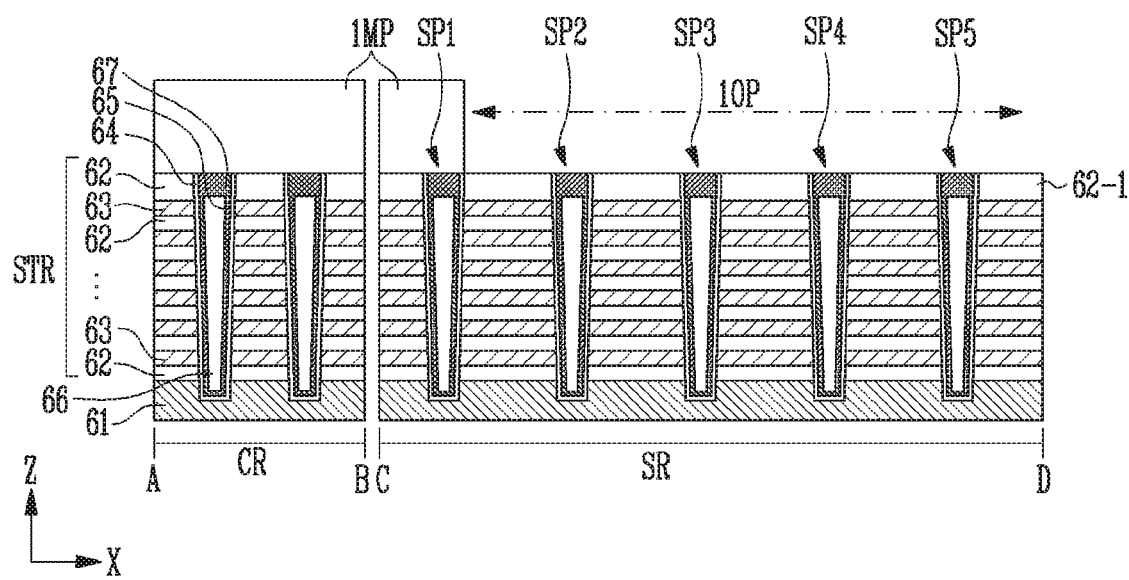

Referring to FIG. 9, a slimming process of exposing each of the second material layers 63 in the slimming region SR may be performed. In detail, the slimming process may include a plurality of mask pattern forming steps and etching steps so as to form, in the slimming region SR, a stepped structure having a plurality of stairs each having a pair of first and second material layers 62 and 63. FIG. 9 illustrates a method of forming a first mask pattern 1MP for forming a first stepped structure.

At the mask pattern forming step, the first mask pattern 1MP may be formed on the entirety of the cell region CR and a portion of the slimming region SR. The first mask pattern 1MP may include a first opening 1OP through which target material to be etched is exposed in the slimming region SR. For example, the first mask pattern 1MP may be formed to cover the entirety of the cell region CR and a portion of the slimming region SR. In other words, the second to fifth support structures SP2 to SP5 and a portion of the first material layer 62-1 formed at an uppermost position among the first and second material layers 62 and 63 may be exposed through the first opening 1OP of the first mask pattern 1MP.

Figure 10:
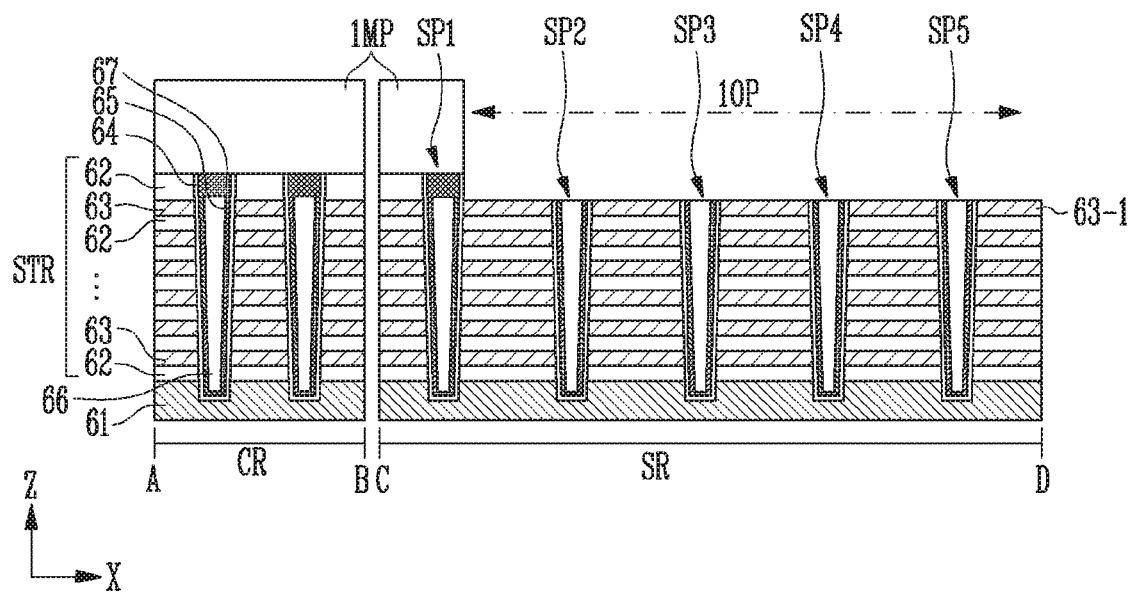

Referring to FIG. 10, at the etching step, an etching process may be performed so that the second material 63-1 is exposed by removing the portion of the uppermost first material layer 62-1 that is exposed through the first opening 1OP. The etching process may be performed in an anisotropic etching manner so that only the exposed portion is removed through the first opening 1OP. The etching process using the first mask pattern 1MP may be performed until the second material layer 63-1 is exposed in the slimming region SR.

At the etching step, upper portions of the second to fifth support structures SP2 to SP5 that are exposed through the first opening 1OP may also be removed when the exposed portion of the first material layer 62-1 is removed. Although FIG. 10 illustrates that upper surfaces of the second to fifth support structures SP2 to SP5 and an upper surface of the second material layer 63-1 are level with each other, the upper portions of the second to fifth support supports SP2 to SP5 may remain unlevel with the upper surface of the second material layer 63-1. For example, the upper surfaces of the second to fifth support structures SP2 to SP5 may remain protruding from the upper surface of the second material layer 63-1. Also, heights of residual portions of the layers in each of the second to fifth support structures SP2 to SP5 may differ from each other depending on etch selectivities of the layers. In an embodiment of the present disclosure, the first to fifth support structures SP1 to SP5 formed in the slimming region SR perform only a function of supporting the stacked structure STR without performing an electrical operation. In such case, shapes of the residual portions of the first to fifth support structures SP1 to SP5 may vary.

Figure 11:
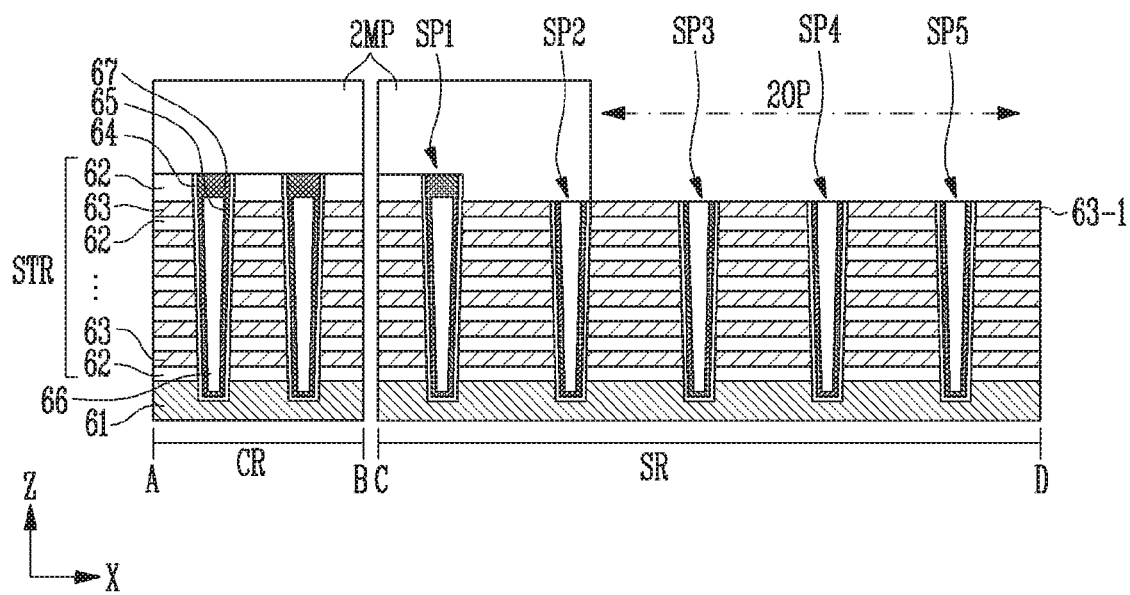

Referring to FIG. 11, if the second material layer 63-1 is exposed in the slimming region SR, the first mask pattern (1MP of FIG. 10) may be removed, and a second mask pattern 2MP including a second opening 2OP may be formed. To form a stepped structure, the second opening 2OP of the second mask pattern 2MP may be less in width than the first opening 1OP. For example, the second mask pattern 2MP may be formed to cover the entirety of the cell region CR and a portion of the slimming region SR. In other words, the third to fifth support structures SP3 to SP5 and a portion of the second material layer 63-1 formed at an uppermost position among the first and second material layers 62 and 63 may be exposed through the second opening 2OP of the second mask pattern 2MP.

Figure 12:
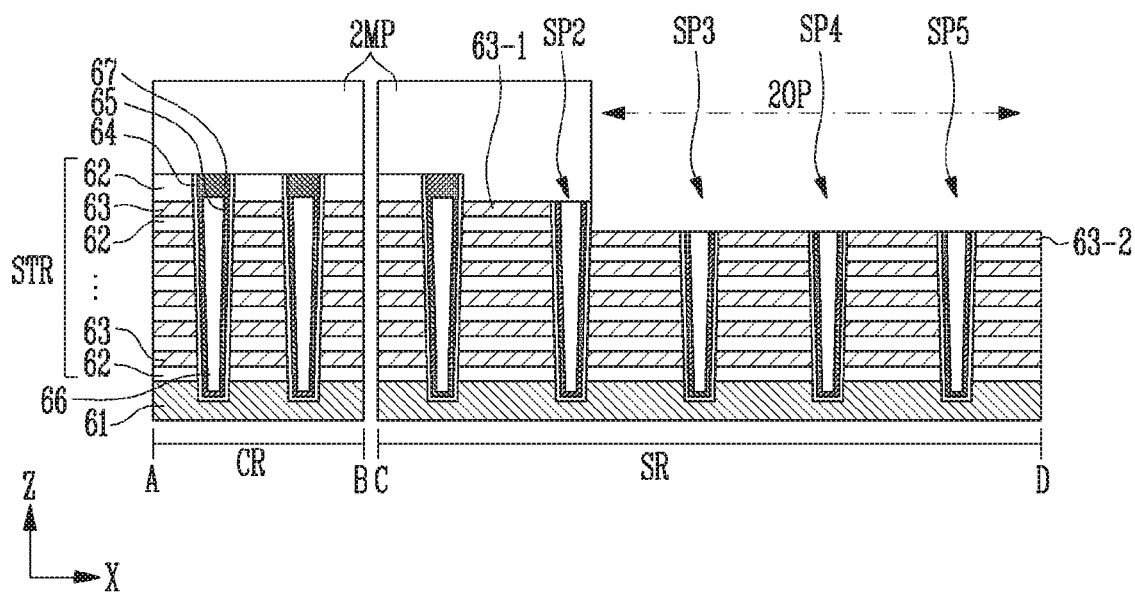

Referring to FIG. 12, an etching process may be performed so that the second material layer 63-2 is exposed by removing a portion of the uppermost second material layer 63-1 that is exposed through the second opening 2OP and a portion of the first material 62 that is formed under the second material 63-1. The etching process may be performed in an anisotropic etching manner so that only the exposed portion is removed through the second opening 2OP. The etching process using the second mask pattern 2MP may be performed until the second material layer 63-2 is exposed in the slimming region SR.

At the etching step, upper portions of the third to fifth support structures SP3 to SP5 that are exposed through the second opening 2OP may also be removed when the exposed portion of the second material 63-1 and the exposed portion of the first material layer 62 are removed. Although FIG. 12 also illustrates that the upper surfaces of the third to fifth support structures SP3 to SP5 are level with the upper surface of the second material layer 63-2, the shapes of the exposed portions of the third to fifth support structures SP3 to SP5 are not necessarily level with the upper surface of the second material layer 63_2 in other embodiments of the present disclosure, as described with reference to FIG. 10.

Figure 13:
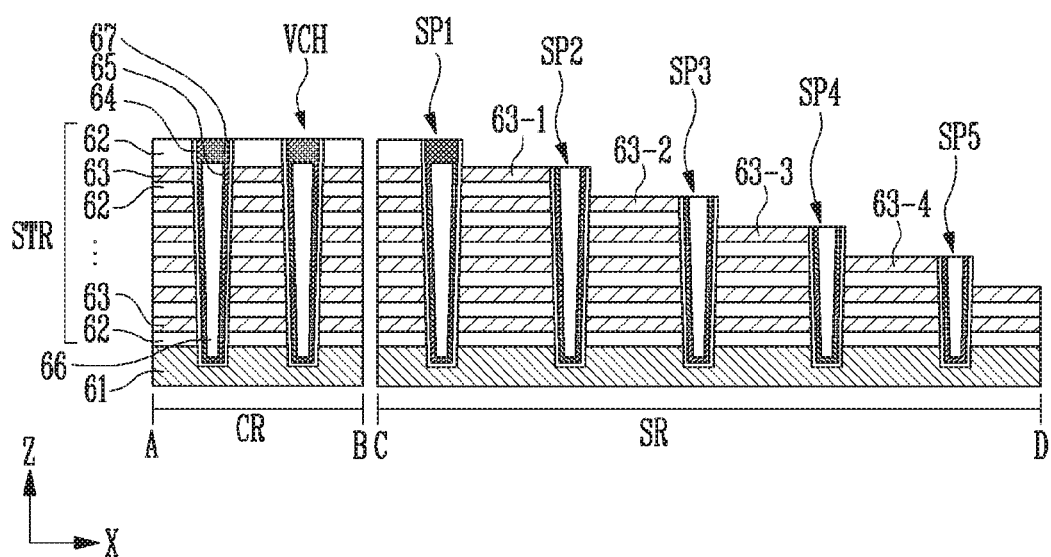

Referring to FIG. 13, the second mask pattern 2MP may be removed. According to the mask pattern forming steps and the etching steps described with reference to FIGS. 9 to 12, a stepped structure may be formed in the slimming region SR by using mask patterns having openings that are gradually reduced in width. For example, a stepped structure in which the second material layers 63-1, 63-2, 63-3, 63-4, . . . are exposed on respective stairs may be formed in the slimming region SR. Because the slimming process is performed in only the slimming region SR, the vertical channel structures VCH formed in the cell region CR may have the same height. Furthermore, in the slimming region SR, support structures that pass through the same layer may have the same height, but support structures that pass through different layers may have different heights. For instance, although the second support structures SP2 may have the same height, the second support structures SP2 may have different height from the third support structures SP3.

Figure 14:
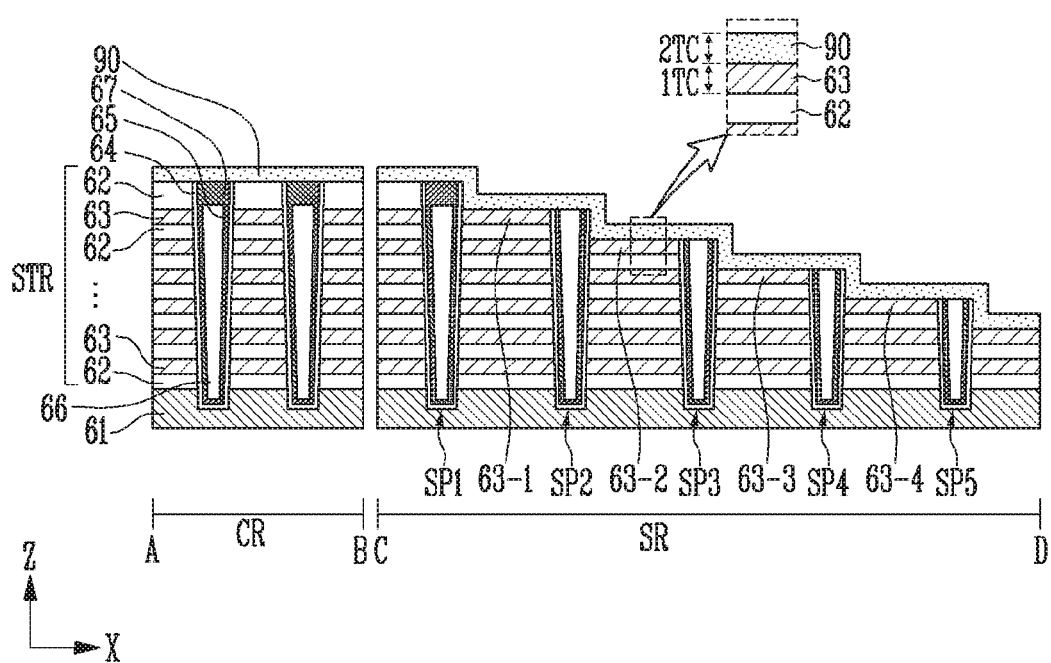

Referring to FIG. 14, an etching prevention layer 90 may be formed along upper surfaces of the cell region CR and the slimming region SR. The etching prevention layer 90 may be formed of material having an etch selectivity different from those of the second material layer 63 or a first interlayer insulating layer (91 of FIG. 15) to be formed during a subsequent process. In other words, the etching prevention layer 90 may be formed of material having an etching rate different from those of the second material layer 63 or the first interlayer insulating layer (91 of FIG. 15). To this end, the etching prevention layer 90 may be formed of a layer including carbon, e.g., an SiCN layer. If the etching prevention layer 90 has an etch selectivity different from that of the second material layer 63, the etching prevention layer 90 may remain during a subsequent etching process of removing the second material layer 63, so that there is no need to increase the thickness of the etching prevention layer 90. If the etching prevention layer 90 is formed of material having an etch selectivity different from that of the first interlayer insulating layer (91 of FIG. 15) to be formed during a subsequent process, a phenomenon in which a conductive layer for word lines is exposed through a contact hole during an etching process of forming the contact hole may be prevented. Furthermore, because there is no need to increase the thickness of the etching prevention layer 90, the thickness of the etching prevention layer 90 may be reduced. For example, if it is assumed that the second material layers 63 each has a first thickness 1TC and the etching prevention layer 90 has a second thickness 2TC, the second thickness 2TC may be the same as the first thickness 1TC. In other words, the etching prevention layer 90 may be formed at the same thickness as that of the second material layers 63.

Figure 15:
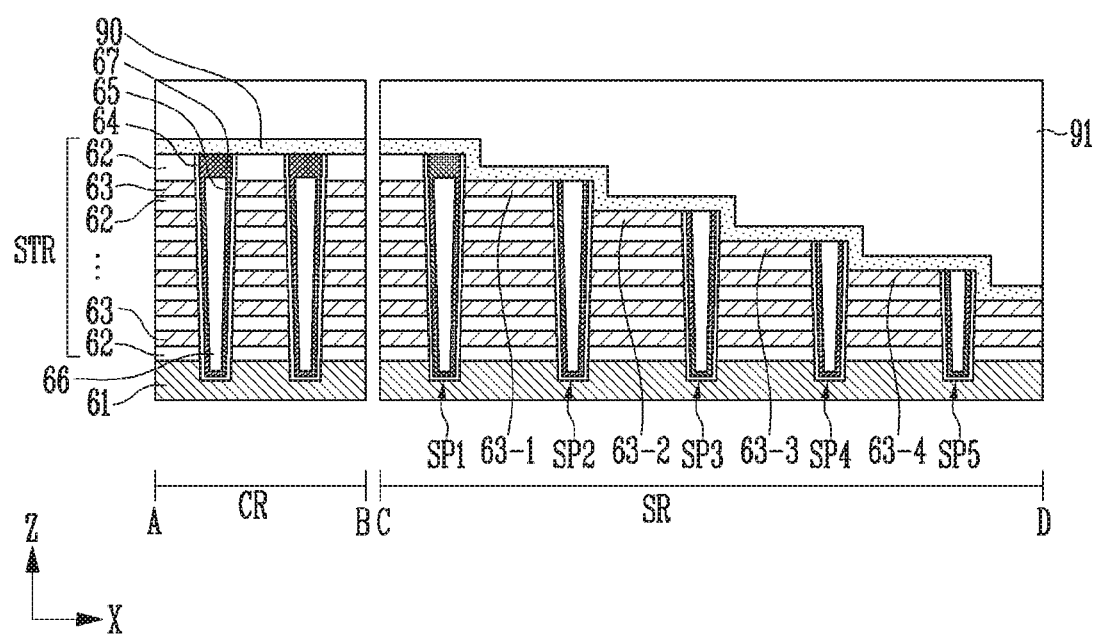

Referring to FIG. 15, a first interlayer insulating layer 91 may be formed over the etching prevention layer 90. The first interlayer insulating layer 91 may be formed of an insulating layer. For example, the first interlayer insulating layer 91 may be formed of oxide.

Figure 16:
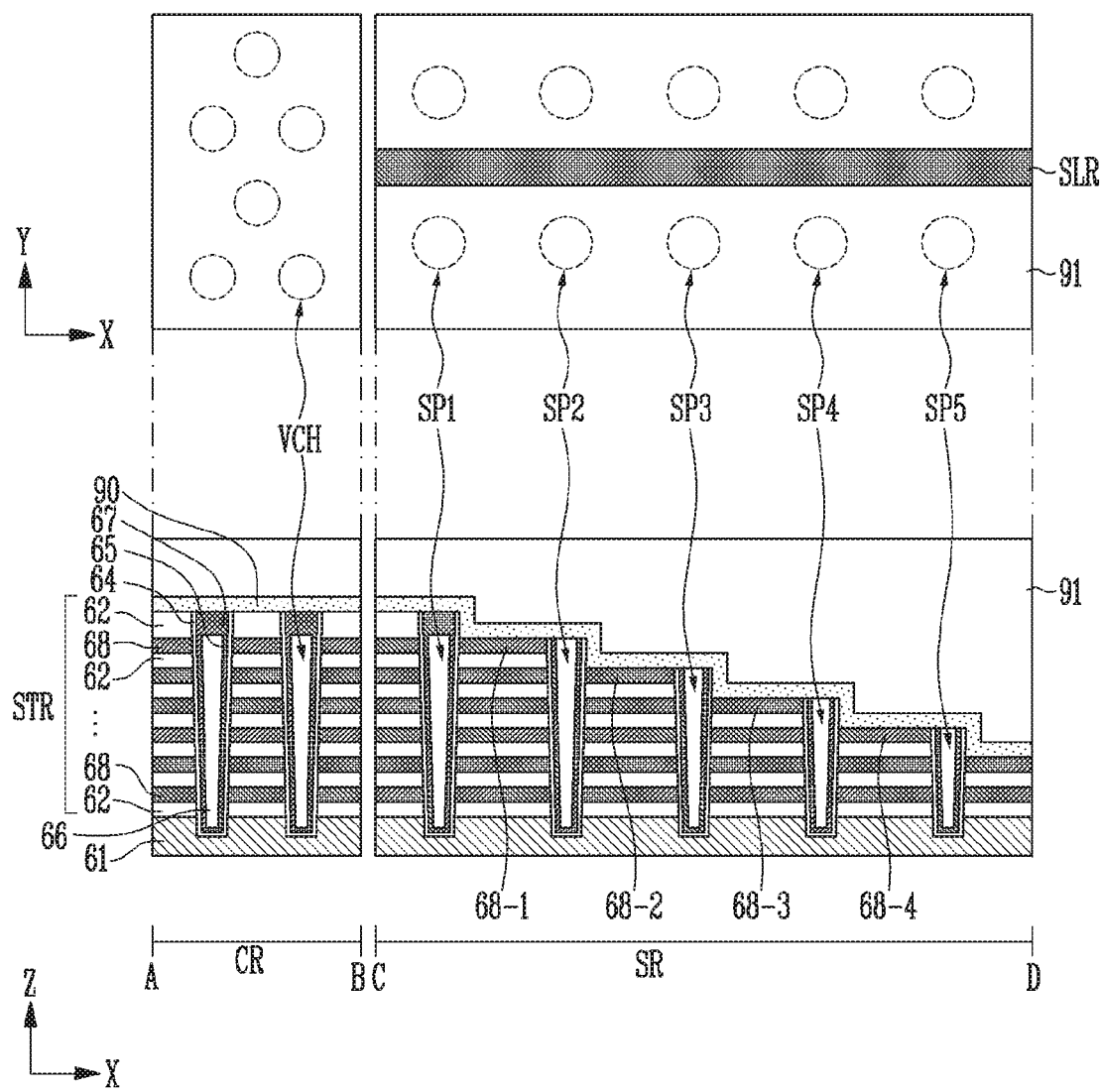

Referring to FIG. 16, a slit region SLR may be formed in the slimming region SR. The slit region SLR may be implemented as a trench which extends in the X direction in the slimming region SR and is etched in the Z direction. For example, a mask pattern (not illustrated) from which the slit region SLR is exposed may be formed on the cell region CR and the slimming region SR, and the trench through which the base 61 is exposed may be formed by performing an etching process with the mask pattern (not illustrated). An etching process of removing the second material layers 63 exposed through the interior of the trench may be performed. A wet etching process may be performed to easily remove the second material layers 63 formed between the first material layers 62. The wet etching process may be performed using an etchant having a higher etch selectivity for the second material layers 63 than that for the etching prevention layer 90. For example, a phosphoric acid solution may be used as the etchant. If the wet etching process is performed using the etchant having a difference in etching selectivity between the second material layers 63 and the etching prevention layer 90, the etching prevention layer 90 may remain while the second material layers 63 are removed.

Thereafter, a first conductive layer 68 for word lines may be charged into the region from which the second material layers 63 have been removed. The first conductive layer 68 may be formed of polysilicon, tungsten, molybdenum, or a combination thereof. After the first conductive layer 68 is formed, the trench may be formed by etching the slit region SLR, and a slit may be formed by filling the trench with insulating material.

Figure 17:
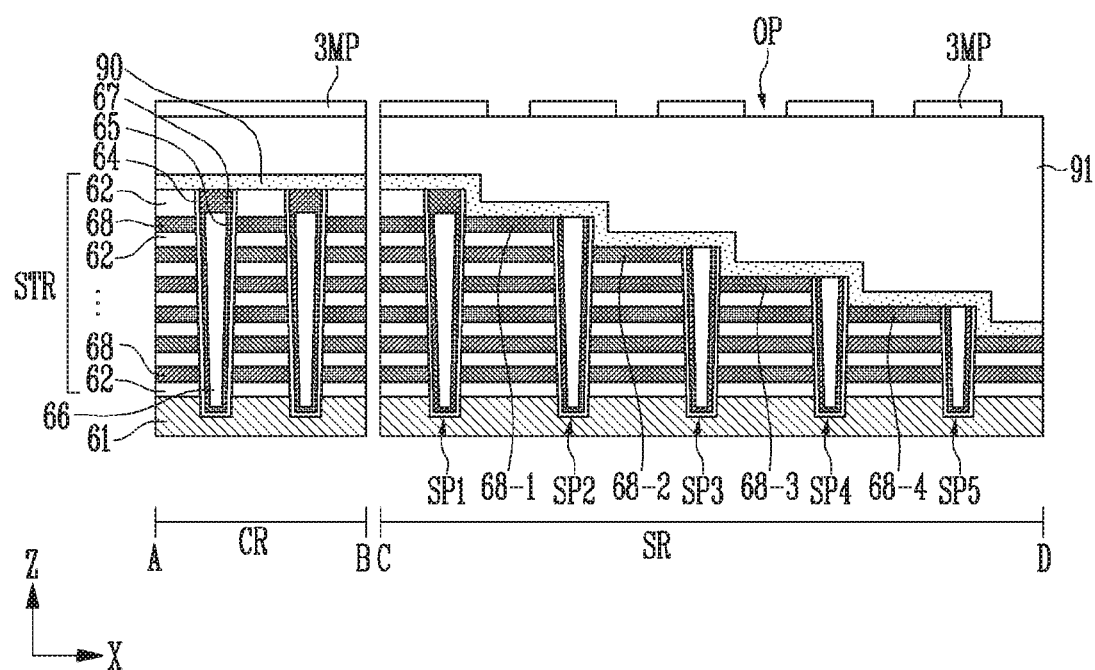

Referring to FIG. 17, a third mask pattern 3MP may be formed on the first interlayer insulating layer 91. The third mask pattern 3MP may be formed of a pattern which covers the entirety of the cell region CR and in which openings OP are formed in the slimming region SLR. Portions of the first interlayer insulating layer 91 of the slimming region SLR may be exposed through the openings OP.

Figure 18:
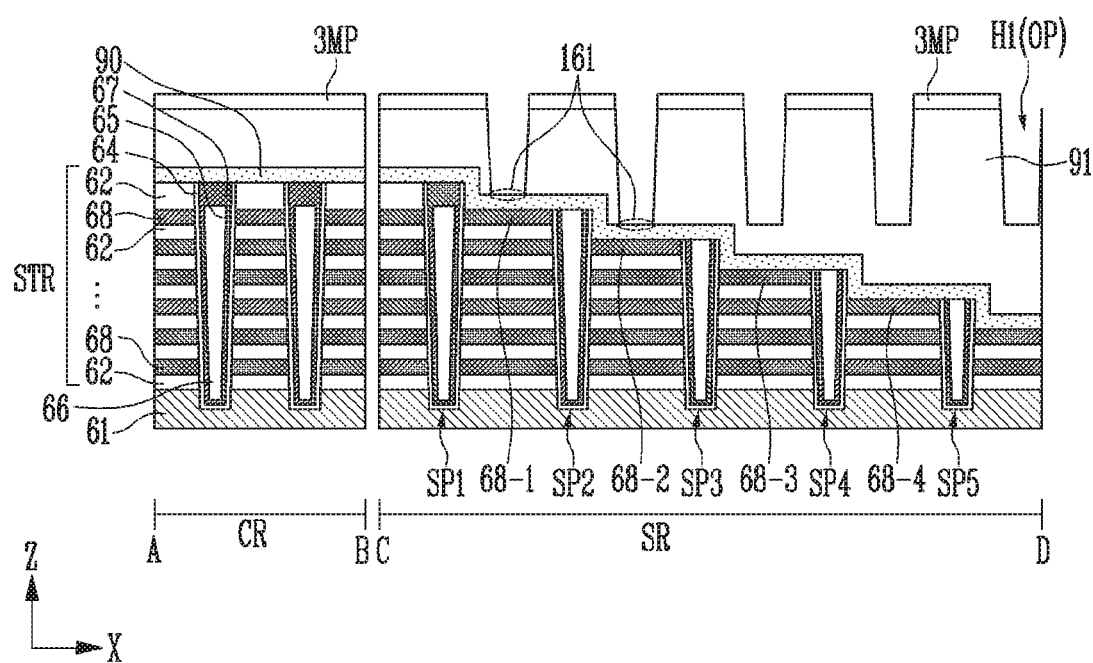

Referring to FIG. 18, an etching process of removing portions of the first interlayer insulating layer 91 that are exposed from the third mask pattern 3MP may be performed. The etching process may be an anisotropic etching process such that only portions of the first interlayer insulating layer 91 exposed through the openings OP is removed. First contact holes H1 may be formed in the portions of the first interlayer insulating layer 91 that have been removed through the etching process. The etching process may be performed using etching gas having a higher etching rate for the first interlayer insulating layer 91 than that for the etching prevention layer 90. Therefore, the etching prevention layer 90 may be first exposed through the first contact hole H1 in the highest region in the stacked structure STR, and the etching prevention layer 90 may be successively exposed through the first contact hole H1 in the next highest region. As such, when the etching process of forming the first contact holes H1 is performed, even if portions 161 of the etching prevention layer 90 are comparatively rapidly exposed through the first contact holes H1, the first conductive layers 68-1, 68-2, . . . that are formed in the uppermost layers of the respective stairs may not be exposed through the first contact holes H1 by the etching prevention layer 90. In other words, during the etching process of forming the first contact holes H1, the first conductive layers 68-1, 68-2, . . . that are formed in the uppermost layers of the respective stairs in the slimming region SR may be protected by the etching prevention layer 90.

Figure 19:
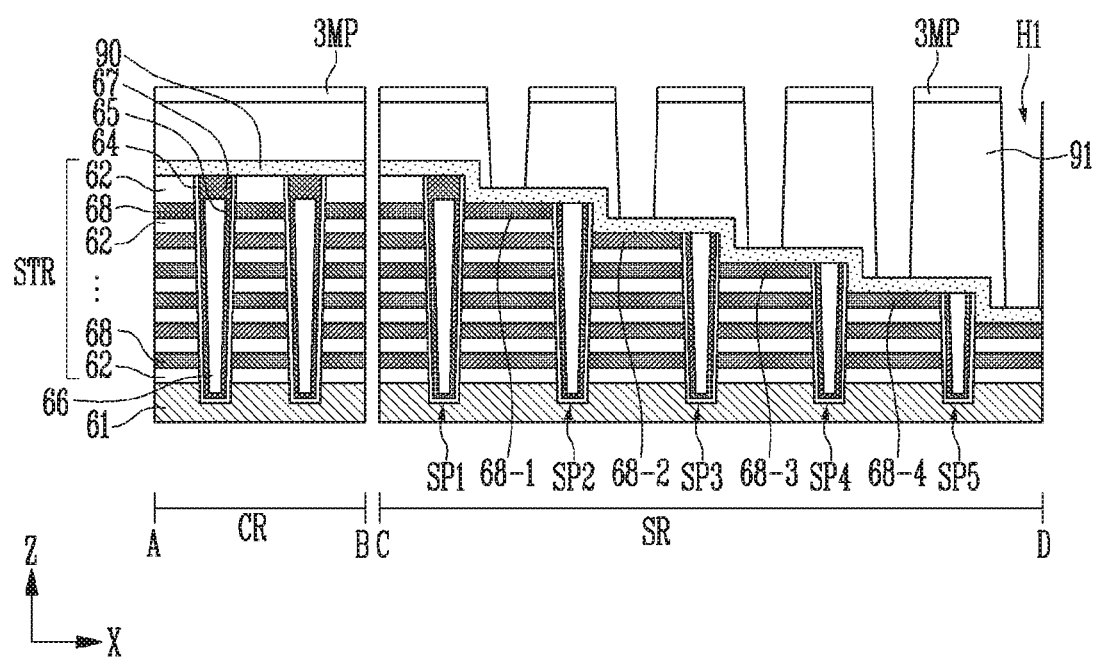

Referring to FIG. 19, if all of the first contact holes H1 are formed in the slimming region SR, the etching prevention layer 90 may be exposed through the bottoms of the first contact holes H1.

Figure 20:
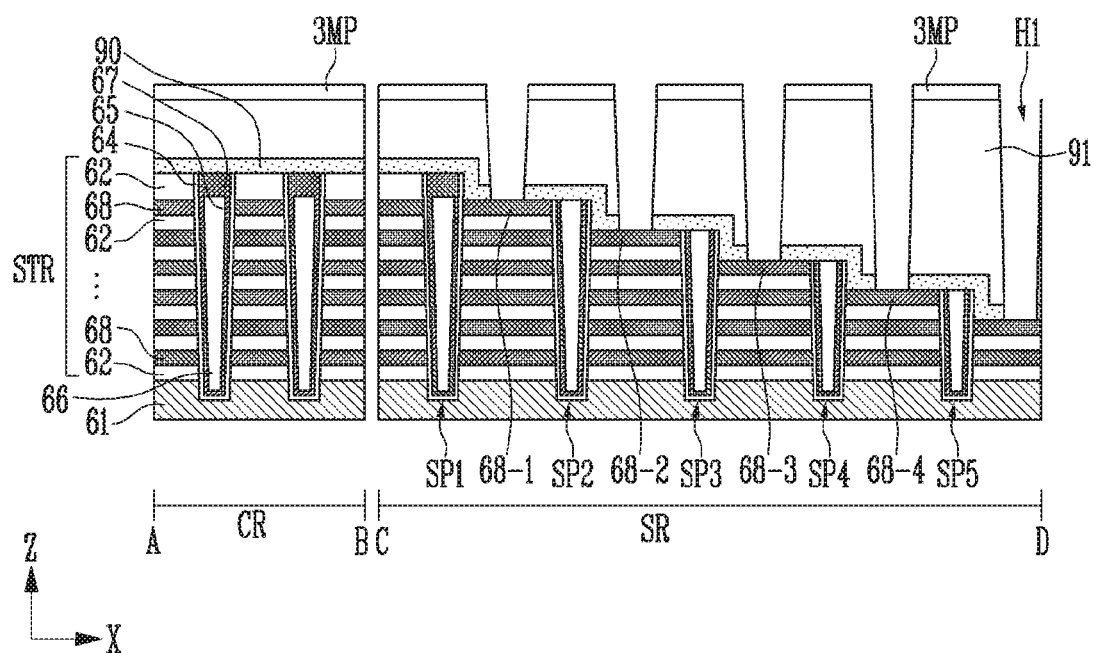

Referring to FIG. 20, an etching process of removing the etching prevention layer 90 exposed through the first contact holes H1 may be performed. The etching process may be performed using etching gas having a higher etching selectivity for the etching prevention layer 90 than that for the first interlayer insulating layer 91 and the first conductive layer 68. The etching process may be performed until the first conductive layers 68-1, 68-2, . . . disposed in the uppermost layer of the respective stairs are exposed through the first contact holes H1.

Figure 21:
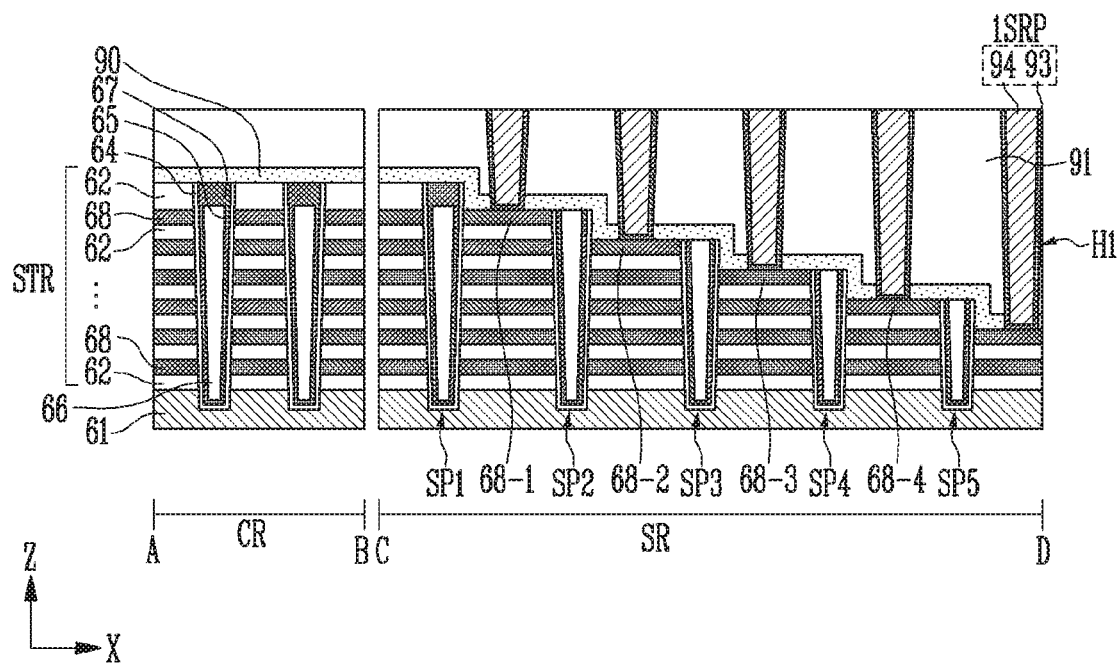

Referring to FIG. 21, a first slimming contact plug 1SRP may be formed in each of the first contact holes H1. The first slimming contact plug 1SRP may include a first barrier layer 93 and a second conductive layer 94. For example, after the first barrier layer 93 is formed along an inner surface of each of the first contact holes H1, the interior of each first contact hole H1 may be filled with the second conductive layer 94. The first barrier layer 93 may be formed of TiN. The second conductive layer 94 may be formed of conductive material such as polysilicon, tungsten, or molybdenum. The first slimming contact plug 1SRP may be formed to abut on the first conductive layers 68-1, 68-2, . . . disposed in the uppermost layers of the respective stairs through the first contact holes H1. During a program, read, or erase operation, the first slimming contact plug 1SRP may be used to transmit operating voltages (Vop of FIG. 1) generated in the voltage generation circuit (112 of FIG. 1) to the first conductive layers 68. After the second conductive layer 94 is formed, a planarization process may be performed to electrically disconnect the first slimming contact plugs 1SRP formed in different regions from each other.

Figure 22:
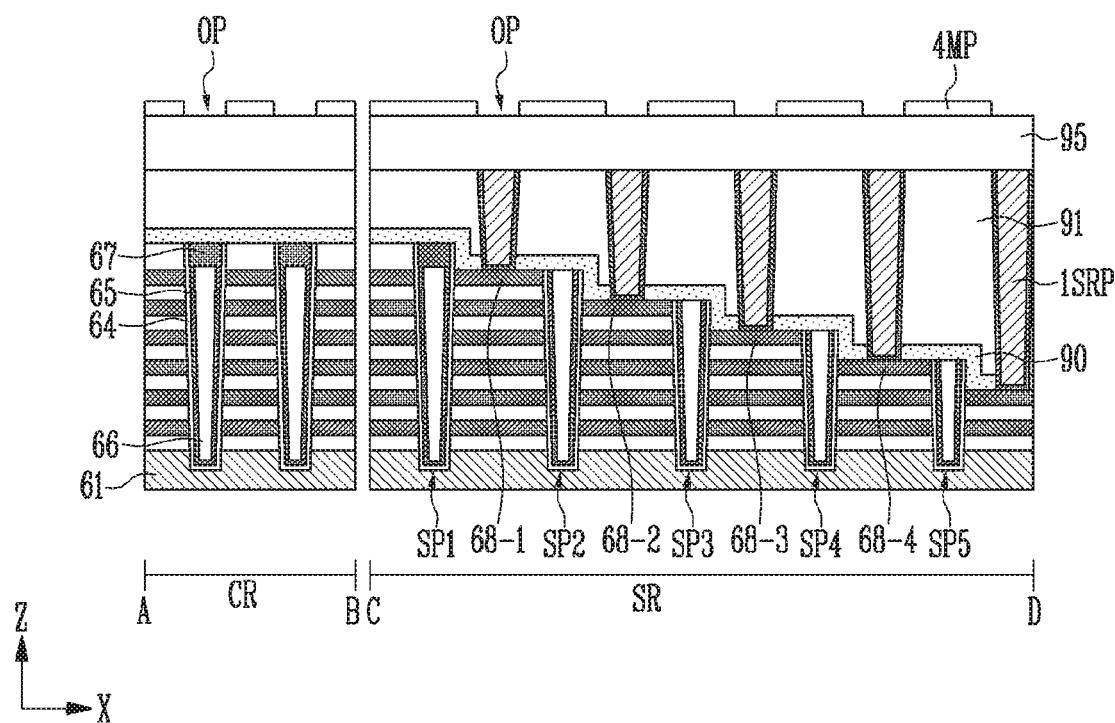

Referring to FIG. 22, a second interlayer insulating layer 95 and a fourth mask pattern 4MP may be successively formed on the first slimming contact plug 1SRP and the first interlayer insulating layer 91. For example, after a second interlayer insulating layer 95 is formed on the first slimming contact plug 1SRP and the first interlayer insulating layer 91, the fourth mask pattern 4MP may be formed over the second interlayer insulating layer 95. The second interlayer insulating layer 95 may be formed of the same material as that of the first interlayer insulating layer 91. For example, the second interlayer insulating layer 95 may be formed of oxide. The fourth mask pattern 4MP may have a pattern in which openings OP are formed in the cell region CR and the slimming region SLR. In the cell region CR, openings OP may be formed in a region in which the vertical channel structures VCH are formed. In the slimming region SR, openings OP may be formed in a region in which the first slimming contact plugs 1SRP are formed.

Figure 23:
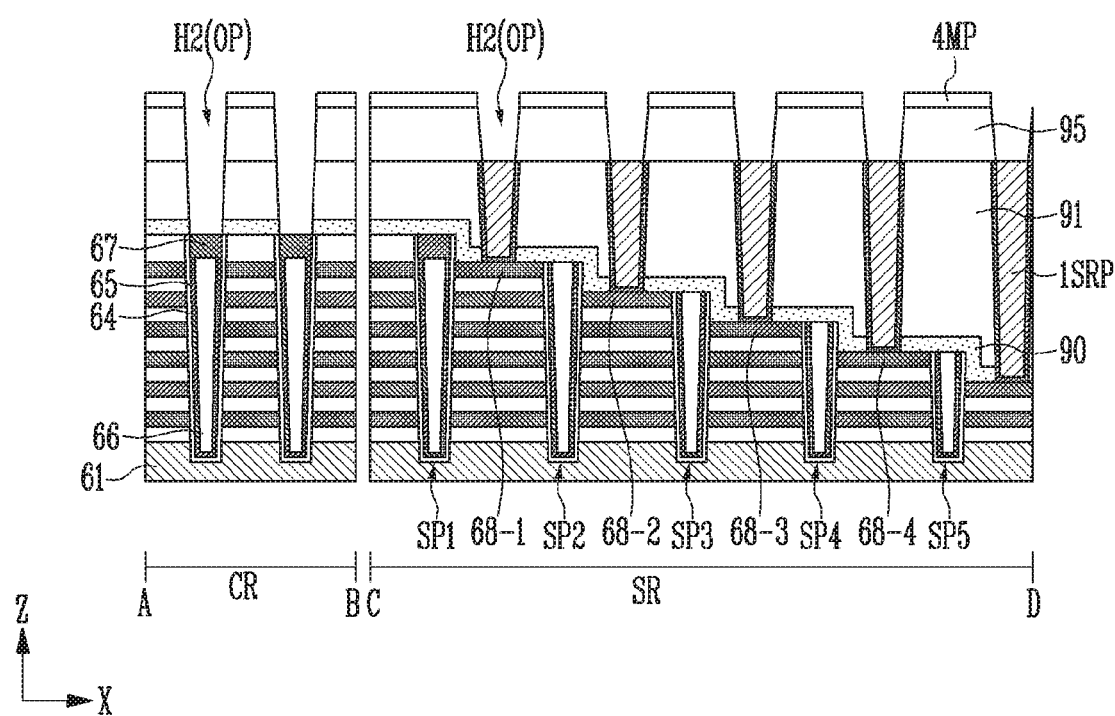

Referring to FIG. 23, an etching process of removing portions of the second interlayer insulating layer 95 and the first interlayer insulating layer 91 that are exposed from the fourth mask pattern 4MP may be performed. The etching process may be an anisotropic etching process such that the second interlayer insulating layer 95 exposed through the openings OP and the first interlayer insulating layer 91 exposed by removing the second interlayer insulating layer 95 are removed. Second contact holes H2 may be formed in the cell region CR and the slimming region SR during the etching process. The second contact holes H2 that are formed in the cell region CR may be formed to expose the etching prevention layer 90. The second contact holes H2 that are formed in the slimming region SR may be formed to expose upper surfaces of the first slimming contact plug 1SRP.

Figure 24:
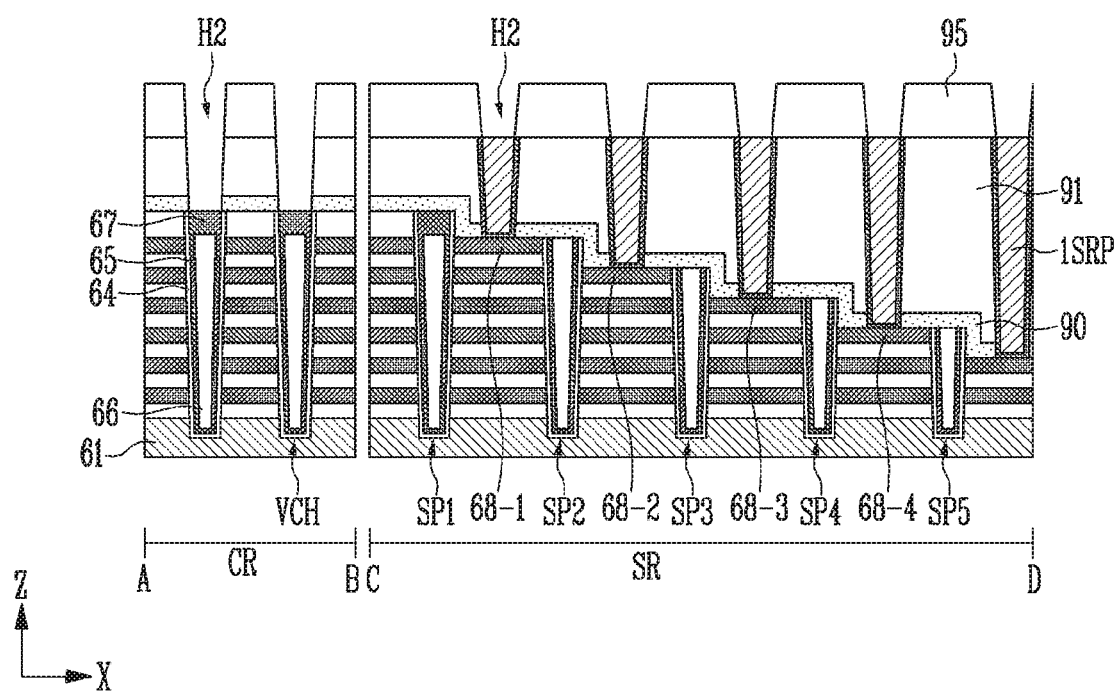

Referring to FIG. 24, an etching process of removing the etching prevention layer 90 exposed through the second contact holes H2 may be performed. The etching process may be performed using etching gas having a higher etching selectivity for the etching prevention layer 90 than that for the first and second interlayer insulating layers 91 and 95 and the first slimming contact plugs 1SRP. The etching process may be performed until the vertical channel structures VCH are exposed through the second contact holes H2.

Figure 25:
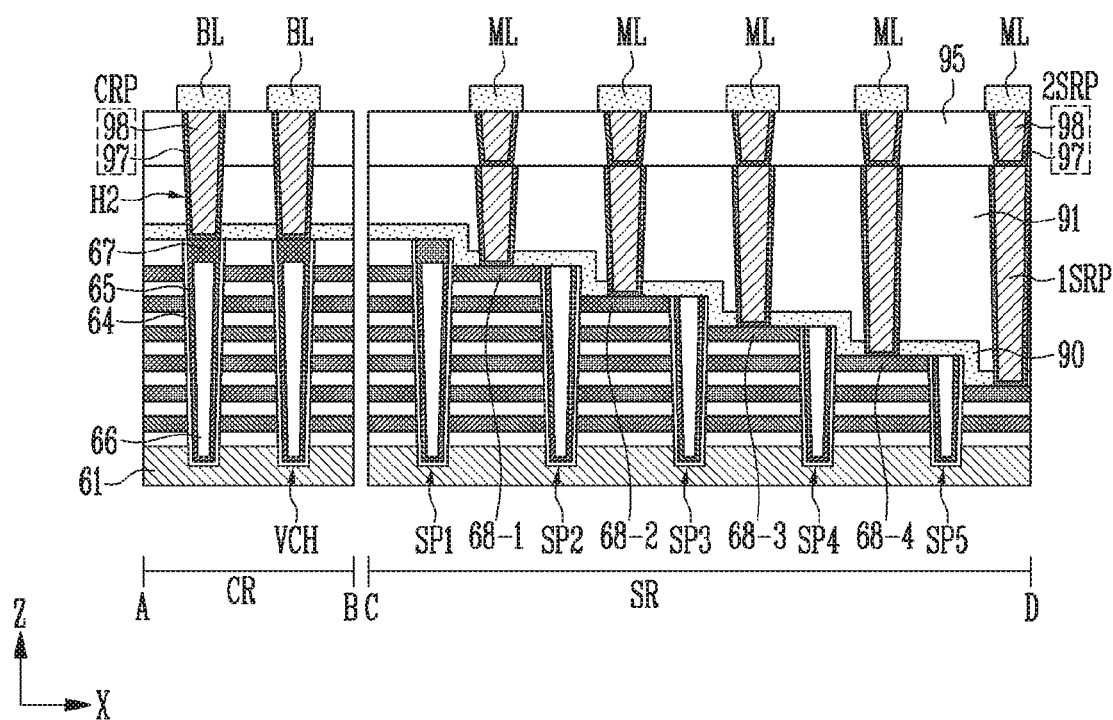

Referring to FIG. 25, a cell contact plug CRP may be formed in each of the second contact holes H2 formed in the cell region CR, and a second slimming contact plug 2SRP may be formed in each of the second contact holes H2 formed in the sliming region SR. The cell contact plug CRP and the second slimming contact plug 2SRP may be simultaneously formed. For example, the cell contact plug CRP and the second slimming contact plug 2SRP may include a second barrier layer 97 and a third conductive layer 98. For example, after the second barrier layer 97 is formed along an inner surface of each of the second contact holes H2, the interior of each second contact hole H2 may be filled with the third conductive layer 98. The second barrier layer 97 may be formed of TiN. The third conductive layer 98 may be formed of conductive material such as polysilicon, tungsten, or molybdenum. The cell contact plug CRP may be formed to abut on the vertical channel structures VCH. The second slimming contact plug 2SRP may be formed to abut on the first slimming contact plug 1SRP.

A bit line BL may be formed over the cell contact plug CRP, and a metal line ML may be formed over the second slimming contact plug 2SRP. The bit line BL may be coupled to the page buffer group (114 of FIG. 1), and the metal line ML may be coupled to the local lines (LL of FIG. 1).

After the third conductive layer 98 is formed, a planarization process may be performed to electrically disconnect the cell contact plugs CRP and the second slimming contact plugs 2SRP formed in different regions from each other.

As described with reference to FIGS. 6 to 25, after the vertical channel structures VCH and the support structures SP1 to SP5 are simultaneously formed in the cell region CR and the slimming region SR, a slimming process of forming a stepped structure in the slimming region SR is performed. Hence, a separate process of forming the support structures SP1 to SP5 may not be needed. Consequently, a phenomenon in which the memory block is inclined may be mitigated of prevented by using the support structures SP1 to SP5 without performing a separate additional process.

Furthermore, because the etching prevention layer 90 is formed in the cell region CR and the slimming region SR before the first contact holes H1 are formed, the first conductive layers 68 for word lines can be protected during the etching process of forming the first contact holes H1.

Figure 26:
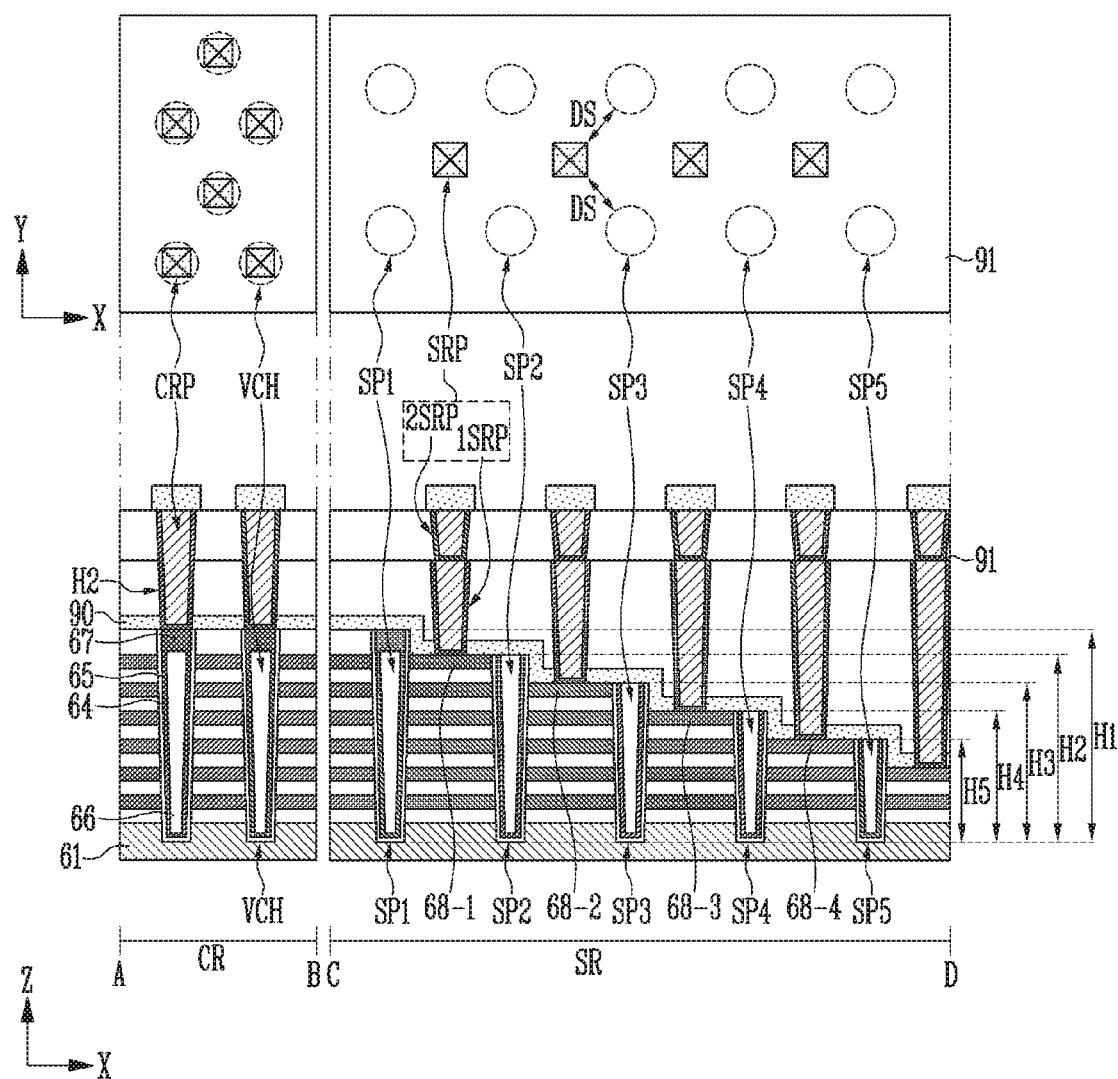
FIG. 26 is a diagram illustrating the structure of the completed memory device in accordance with the first embodiment of the present disclosure.

FIG. 26 is a diagram illustrating the structure of the completed memory device in accordance with the first embodiment of the present disclosure.

Referring to FIG. 26, each of the support structures SP1 to SP5 that are formed by the manufacturing method described with reference to FIGS. 6 to 25 may be formed to pass through an edge area of the corresponding stair in a vertical direction (the Z direction). When the slimming process of forming the stepped structure in the slimming region SR is completed, the first to fifth support structures SP1 to SP5 formed in the slimming region SR may have different heights depending on the shape of the stacked structure STR. For example, the first support structures SP1 may have a first height H1 equal to that of the vertical channel structure VCH. The second support structures SP2 may have a second height H2 less than the first height H1. In this way, the first to fifth support structures SP1 to SP5 may have different heights H1 to H5. Here, the term "height" means a length from the bottom of each of the first to fifth support structures SP1 to SP5 to the top thereof.

Furthermore, if the first to fifth support structures SP1 to SP5 are formed to abut on the ends of the respective stairs, a distance DS between the first to fifth support structures SP1 to SP5 and the slimming contact plugs SRP formed of the first and second slimming contact plugs 1SRP and 2SRP may be increased. Hence, the manufacturing process may be facilitated. In addition, when a voltage is applied to the slimming contact plugs SRP during a subsequent operation, an electrical coupling phenomenon which may occur between the slimming contact plugs SRP and the first to fifth support structures SP1 to SP5 may be prevented. For example, in the case where the distance DS between the slimming contact plugs SRP and the first to fifth support structures SP1 to SP5 is relatively small, coupling may occur between the slimming contact plugs SRP and the first to fifth support structures SP1 to SP5. Therefore, an increase in the distance DS between the slimming contact plugs SRP and the first to fifth support structures SP1 to SP5 may prevent the reliability of the memory device from deteriorating.

FIGS. 27 to 30 are diagrams for describing a method of manufacturing a memory device in accordance with a second embodiment of the present disclosure.

In the drawings illustrated in FIGS. 27 to 30, like reference numerals are used to denote the same components as those of the first embodiment, and reference numerals used in FIGS. 27 to 30 do not indicate a sequence of forming the components.

Figure 27:
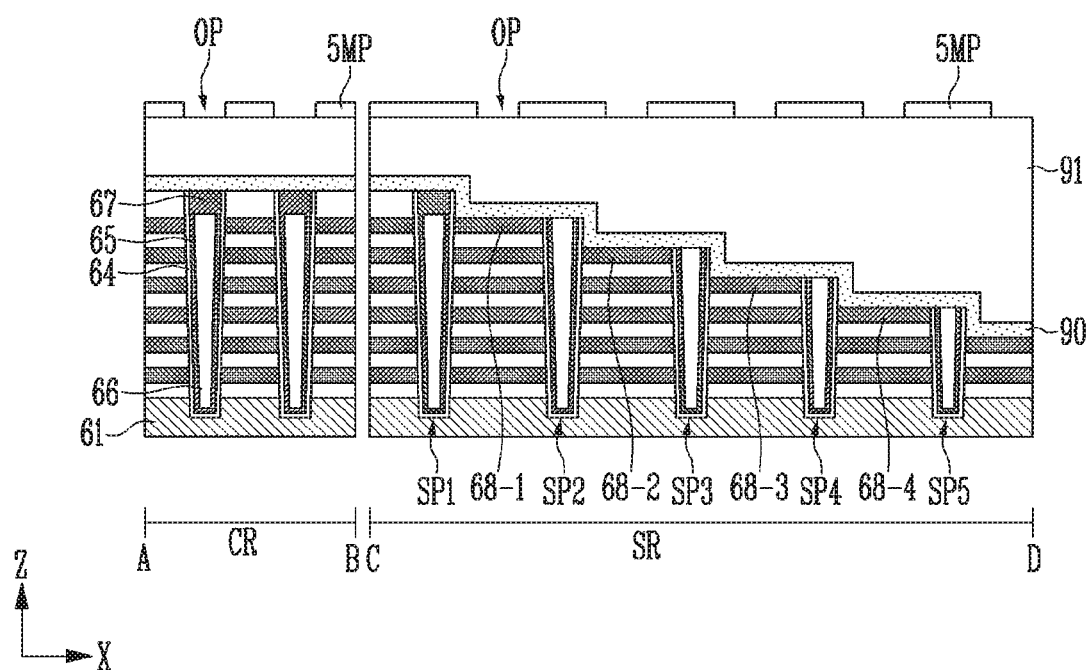
FIGS. 27 to 30 are diagrams for describing a method of manufacturing a memory device in accordance with a second embodiment of the present disclosure.

In the second embodiment, cell contact plugs CRP and slimming contact plugs SRP may be simultaneously formed in the cell region CR and the slimming region SR. In the second embodiment, descriptions of the steps previous to the step of forming the cell contact plugs CRP and the slimming contact plugs SRP are the same as those of the drawings shown in FIGS. 6 to 16 of the first embodiment. Hence, in the second embodiment, explanations duplicated with the first embodiment is omitted. FIG. 27 illustrates a structure corresponding to the step following the step of forming the structure shown in FIG. 16.

Referring to FIG. 27, a fifth mask pattern 5MP may be formed on the first interlayer insulating layer 91. The fifth mask pattern 5MP may be formed of a pattern in which openings OP are formed in the cell region CR and the slimming region SLR. For example, in the cell region CR, openings OP may be formed in regions in which the vertical channel structures VCH are formed. In the slimming region SR, openings OP may be formed in regions between the first to fifth support structures SP1 to SP5.

Figure 28:
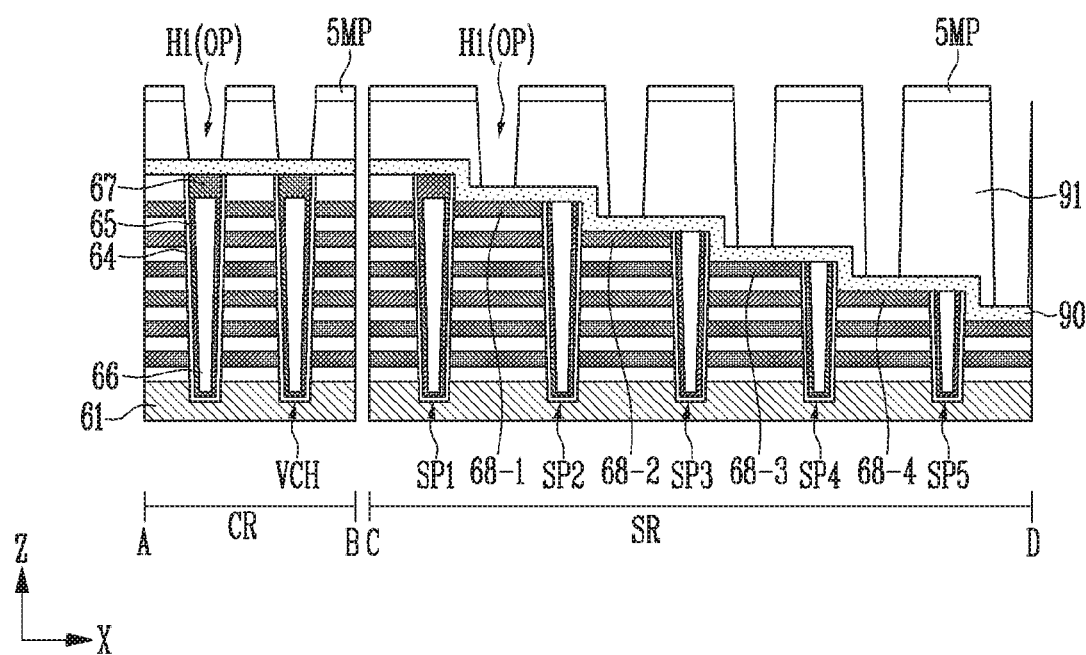

Referring to FIG. 28, an etching process of removing portions of the first interlayer insulating layer 91 that are exposed from the fifth mask pattern 5MP may be performed. The etching process may be an anisotropic etching process such that portions of the first interlayer insulating layer 91 exposed through the openings OP are removed. First contact holes H1 may be formed in the cell region CR and the slimming region SR during the etching process. The etching process may be performed until the etching prevention layer 90 is exposed through the first contact holes H1. Because during the etching process the etching prevention layer 90 may remain without being etched, the first conductive layers 68-1, 68-2, . . . may be protected by the etching prevention layer 90 until the etching prevention layer 90 is exposed through the first contact hole H1 having the greatest depth.

Figure 29:
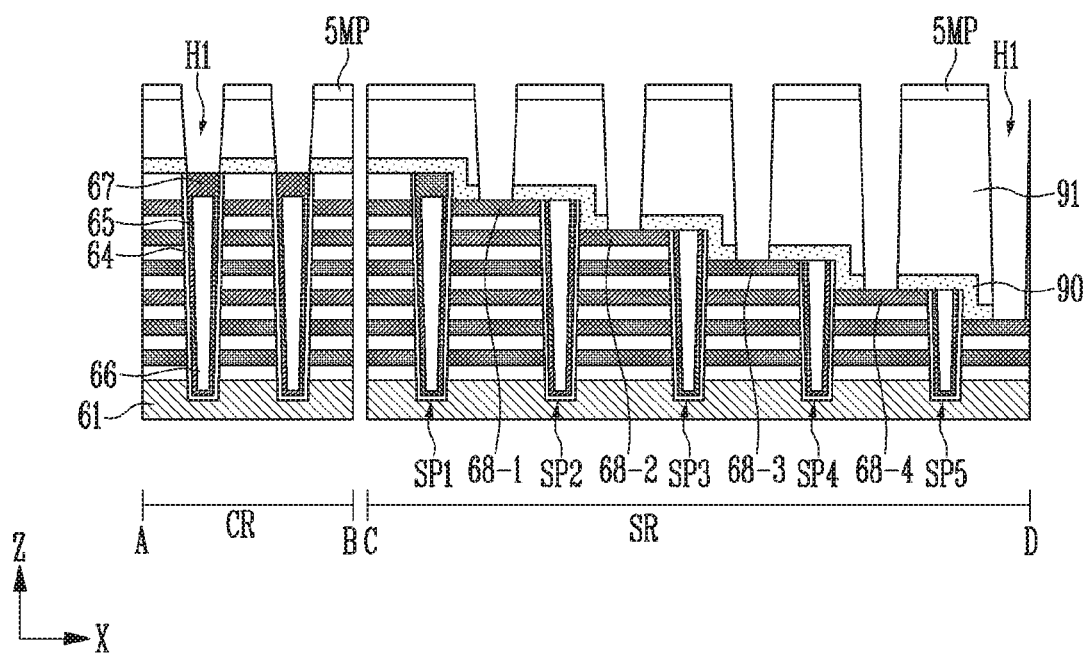

Referring to FIG. 29, an etching process of removing the etching prevention layer 90 exposed through the first contact holes H1 may be performed. The etching process may be performed using etching gas having a higher etching selectivity for the etching prevention layer 90 than that for the first interlayer insulating layer 91 and the first conductive layers 68-1, 68-2, . . . . The etching process may be performed until the upper surfaces of the vertical channel structures VCH of the cell region CR and the first conductive layers 68-1, 68-2, . . . disposed in the uppermost ends of the respective stairs in the slimming region SR are exposed.

Figure 30:
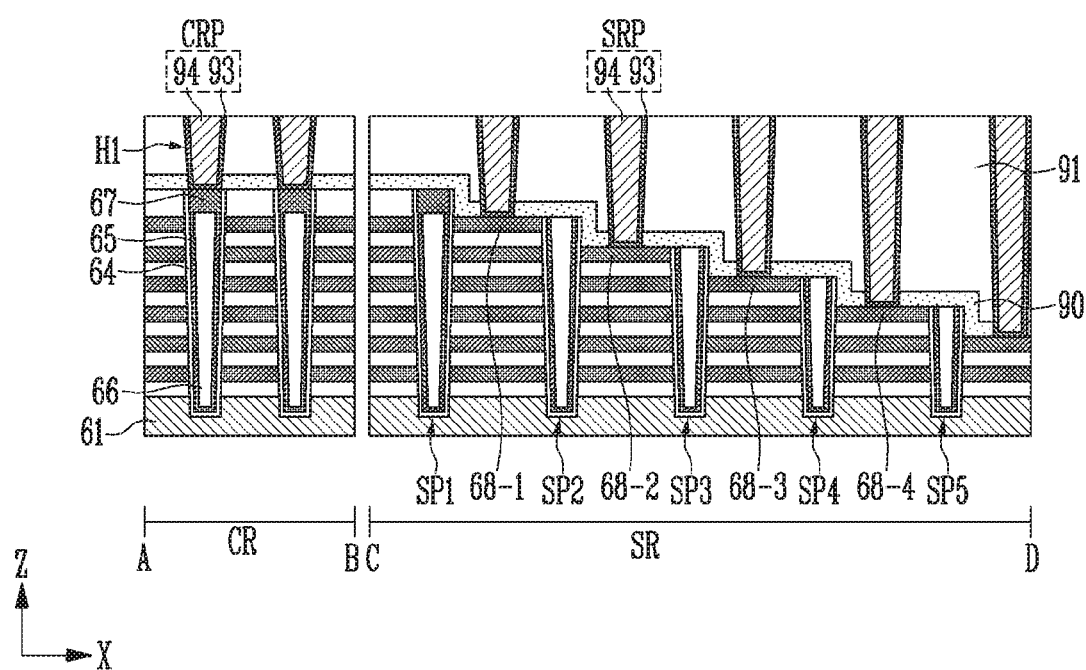

Referring to FIG. 30, a cell contact plug CRP may be formed in each of the first contact holes H1 formed in the cell region CR, and a slimming contact plug SRP may be formed in each of the first contact hole H1 formed in the sliming region SR. The cell contact plugs CRP and the slimming contact plugs SRP may be simultaneously formed. For example, the cell contact plugs CRP and the slimming contact plugs SRP may include a first barrier layer 93 and a second conductive layer 94. For example, after the first barrier 93 is formed along an inner surface of each of the first contact holes H1, the interior of each first contact hole H1 may be filled with the second conductive layer 94. The first barrier layer 93 may be formed of TiN. The second conductive layer 94 may be formed of conductive material such as polysilicon, tungsten, or molybdenum. The cell contact plugs CRP may be formed to abut on the vertical channel structures VCH. The slimming contact plugs SRP may be formed to respectively abut on the first conductive layers 68-1, 68-2, . . . .

The cell contact plugs CRP may electrically couple the vertical channel structures VCH and bit lines to be formed during a subsequent process. During a program, read, or erase operation, the slimming contact plugs SRP may be used to transmit operating voltages (Vop of FIG. 1) generated in the voltage generation circuit (112 of FIG. 1) to the first conductive layers 68-1, 68-2, . . . which can be used as word lines. After the third conductive layer 98 is formed, a planarization process may be performed to electrically disconnect the cell contact plugs CRP and the second slimming contact plugs 2SRP formed in different regions from each other.

FIGS. 31 to 38 are diagrams for describing a method of manufacturing a memory device and the structure of the completed memory device in accordance with a third embodiment of the present disclosure.

Figure 31:
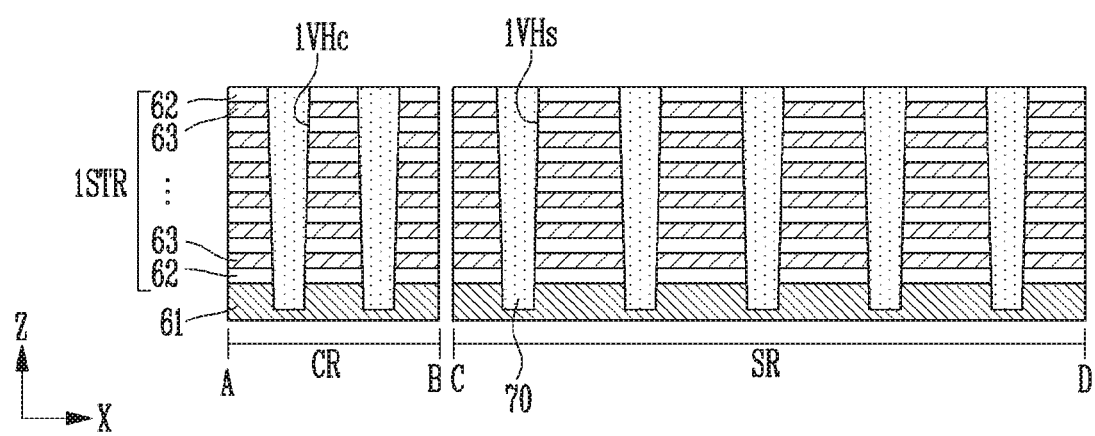
FIGS. 31 to 38 are diagrams for describing a method of manufacturing a memory device and the structure of the completed memory device in accordance with a third embodiment of the present disclosure.

In the drawings illustrated in FIGS. 31 to 38, like reference numerals are used to denote the same components as those of the first embodiment, and reference numerals used in FIGS. 31 to 38 do not indicate a sequence of forming the components. Referring to FIG. 31, a first stacked structure 1STR may be formed on a base 61. The first stacked structure 1STR may include first material layers 62 and second material layers 63 that are alternately stacked. The base 61, the first material layers 62, and the second material layers 63 have been described in the first embodiment; therefore, repetitive explanation thereof will be omitted.

First vertical holes 1VHc and 1VHs which vertically pass through the first stacked structure 1STR and expose portions of the base 61 may be formed. The first vertical holes 1VHc and 1VHs may be filled with sacrificial layers 70. The sacrificial layers 70 may be formed of material having an etch selectivity higher than that of the first and second material layers 62 and 63 so that the sacrificial layers 70 may be removed during a subsequent etching process. The first vertical holes 1VHc formed in the cell region CR may be used to form vertical channel structures. The first vertical holes 1VHs formed in the slimming region SR may be used to form support structures.

Figure 32:
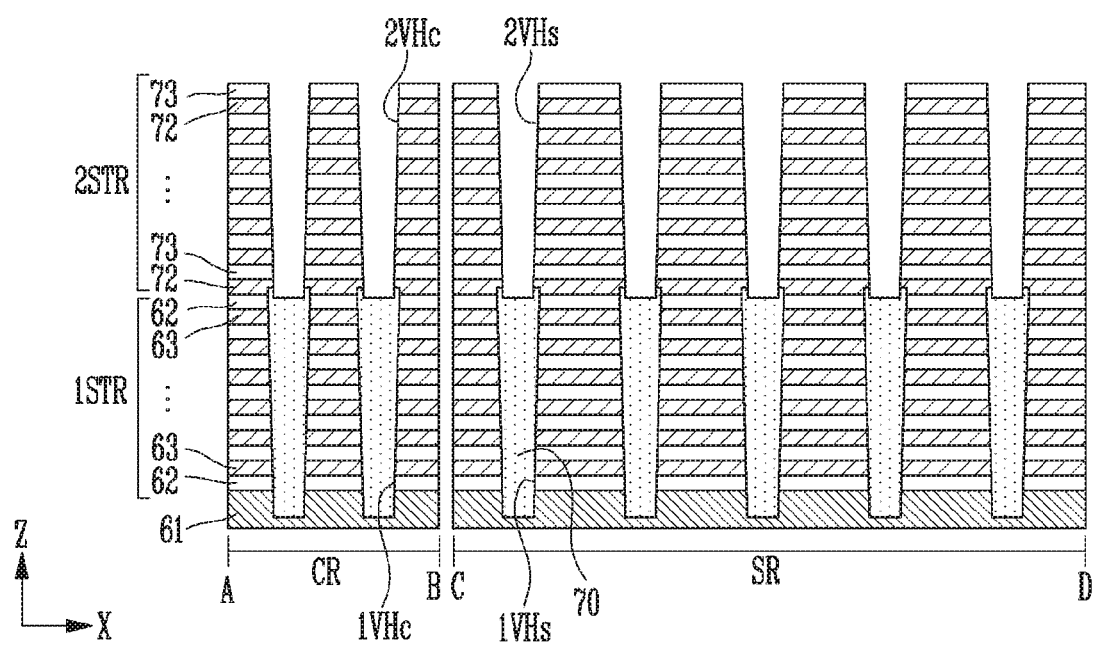

Referring to FIG. 32, a second stacked structure 2STR may be formed on the first stacked structure 1STR provided with the sacrificial layer 70. The second stacked structure 2STR may include third material layers 72 and fourth material layers 73 that are alternately stacked. For example, the third material layers 72 may be made of the same material as that of the second material layers 63 of the first stacked structure 1STR. The fourth material layers 73 may be made of the same material as that of the first material layers 62 of the first stacked structure 1STR. A fourth material layer 73 may be formed on the uppermost end of the second stacked structure 2STR.

After the second stacked structure 2STR has been formed, second vertical holes 2VHc and 2VHs which vertically pass through the second stacked structure 2STR may be formed so that portions of the sacrificial layer 70 may be exposed through the second vertical holes 2VHc and 2VHs. For example, the second vertical holes 2VHc and 2VHs may be respectively formed over the first vertical holes 1VHc and 1VHs.

Figure 33:
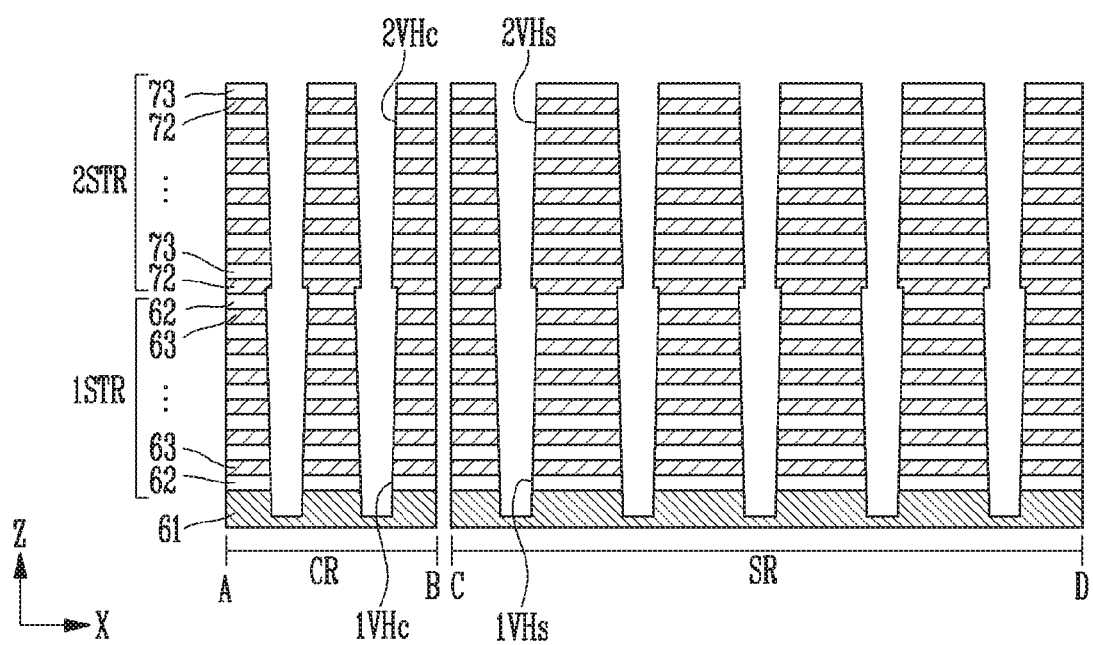

Referring to FIG. 33, the sacrificial layer (70 of FIG. 32) that is exposed through the second vertical holes 2VHc and 2VHs may be removed so that the first to fourth material layers 62, 63, 72, and 73 may be exposed through the first and second vertical holes 1VHc, 1VHs, 2VHc, and 2VHs.

Figure 34:
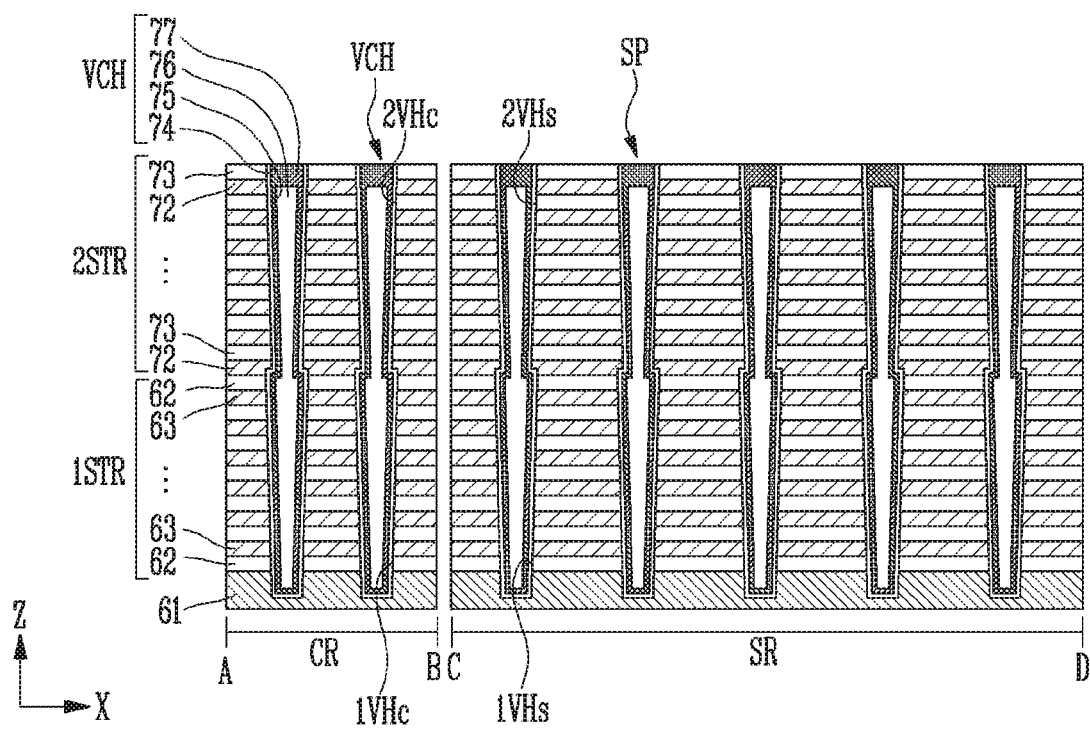

Referring to FIG. 34, vertical channel structures VCH and support structures SP each including the memory layer 74, the channel layer 75, the vertical insulating layer 76, and the capping layer 77 may be formed in the first and second vertical holes 1VHc, 1VHs, 2VHc, and 2VHs.

The memory layer 74 may be formed in a hollow cylindrical shape along an inner surface of each of the first and second vertical holes 1VHc, 1VHs, 2VHc, and 2VHs. The channel layer 75 may be formed in a hollow cylindrical shape along an inner surface of the memory layer 74. The vertical insulating layer 76 may be provided in the form of a cylinder with which space defined by the channel layer 75 is filled. Although not illustrated, in various embodiments, the channel layer 75 may be provided in the form of a cylinder. In this case, the vertical insulating layer 76 may not be formed. The capping layer 77 may be formed on the channel layer 75 and the vertical insulating layer 76 and be enclosed by the memory layer 74.

In the cell region CR, portions of each vertical channel structure VCH that are adjacent to the second and third material layers 63 and 72 may be used as memory cells. The support structures SP formed in the slimming region SR may be used to support the first and second stacked structures 1STR and 2STR.

Figure 35:
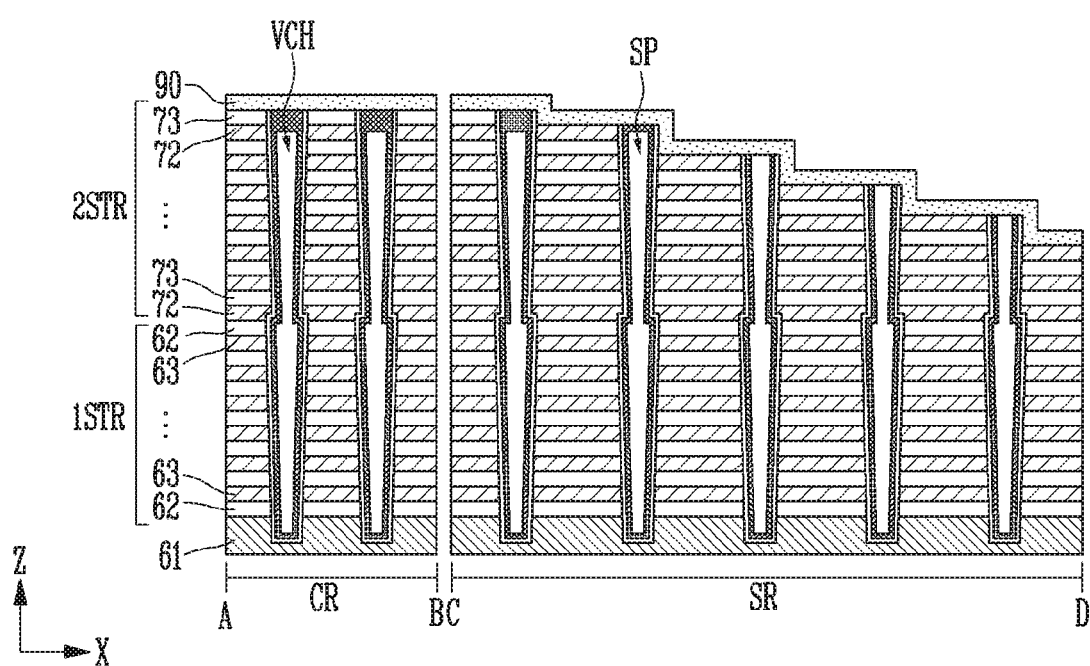

Referring to FIG. 35, a slimming process of slimming, to form a stepped structure, the first to fourth material layers 62, 63, 72, and 73 formed in the slimming region SR may be performed. During the slimming process, as described with reference to FIGS. 9 to 13, the mask pattern forming steps and the etching steps may be performed. During the slimming process, not only may the first to fourth material layers 62, 63, 72, and 73 exposed in the slimming region SR be etched, but the support structures SP may also be etched.

After a stepped structure is formed in the slimming region SP, an etching prevention layer 90 is formed along the upper surfaces of the cell region CR and the slimming region SR.

The etching prevention layer 90 may be formed of material having an etch selectivity different from that of the first interlayer insulating layer (91 of FIG. 36) to be formed during a subsequent process. In other words, the etching prevention layer 90 may be formed of material having an etching rate different from that of the first interlayer insulating layer (91 of FIG. 36). The etching prevention layer 90 may be formed of a layer including carbon, e.g., an SiCN layer. If the etching prevention layer 90 is formed of material having an etch selectivity different from that of the first interlayer insulating layer (91 of FIG. 36) to be formed during a subsequent process, a phenomenon in which a conductive layer for word lines is exposed through a contact hole during an etching process of forming the contact hole may be prevented. Furthermore, because there is no need to increase the thickness of the etching prevention layer 90, the thickness of the etching prevention layer 90 may be reduced. For example, the etching prevention layer 90 may be formed at the same thickness as that of the second material layers 63.

Figure 36:
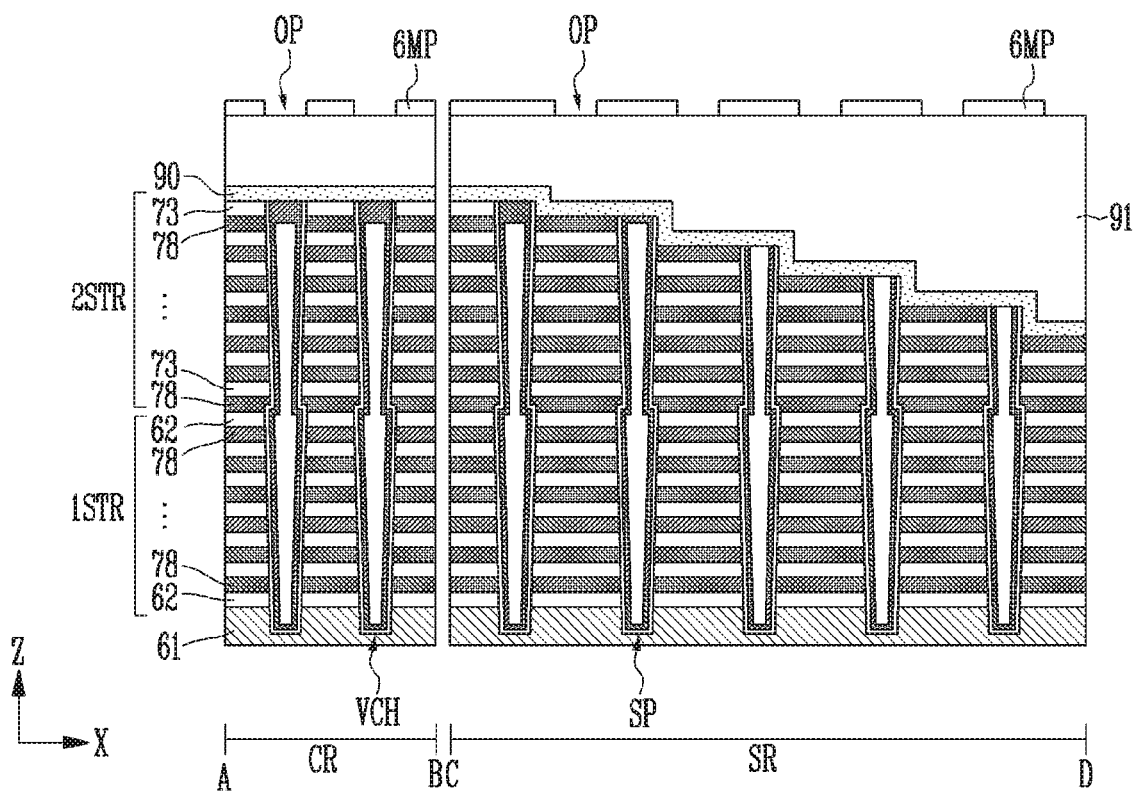

Referring to FIG. 36, a first interlayer insulating layer 91 may be formed over the etching prevention layer 90. The first interlayer insulating layer 91 may be formed of an insulating layer. For example, the first interlayer insulating layer 91 may be formed of oxide. Thereafter, the second and third material layers 63 and 72 are removed, and a fourth conductive layer 78 for word lines is formed. A method of removing the second and third materials 63 and 72 and forming the fourth conductive layer 78 is similar to that of the description with reference to the drawings shown in FIG. 16; therefore description thereof will be omitted. After the slit is formed in the slimming region SR (refer to FIG. 16), a sixth mask pattern 6MP may be formed over the first interlayer insulating layer 91.

The sixth mask pattern 6MP may have a pattern in which openings OP are formed in the cell region CR and the slimming region SLR. In the cell region CR, openings OP may be formed in a region in which the vertical channel structures VCH are formed. In the slimming region SR, openings OP may be formed in a region in which the first slimming contact plugs 1SRP are formed. The openings OP of the cell region CR may be formed in a region in which the vertical channel structures VCH are formed. The openings OP of the slimming region SR may be formed in a region in which the support structures SP are formed.

Figure 37:
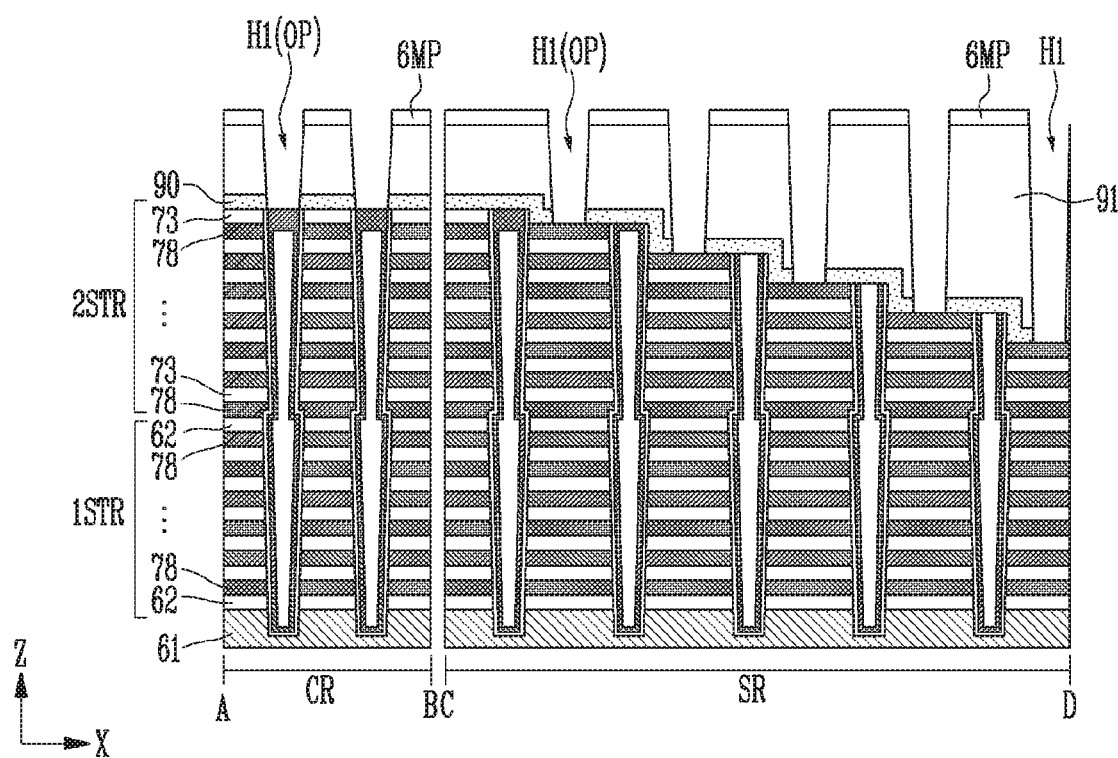

Referring to FIG. 37, an etching process of forming first contact holes H1 in the cell region CR and the slimming region SR with the sixth mask pattern 6MP may be performed. The etching process may be an anisotropic etching process such that portions of the first interlayer insulating layer 91 exposed through the openings OP can be removed. The etching process of forming the first contact holes H1 may be performed until the etching prevention layer 90 is exposed through all of the first contact holes H1. The etching process may be performed using etching gas having a higher etching rate for the first interlayer insulating layer 91 than that for the etching prevention layer 90. Therefore, during the etching process of forming the first contact holes H1, the fourth conductive layer 78 in the slimming region SR may be protected by the etching prevention layer 90.

If the etching prevention layer 90 is exposed through all of the first contact holes H1, an additional etching process of removing the exposed etching prevention layer 90 may be performed. The additional etching process may be performed using etching gas having a higher etching selectivity for the etching prevention layer 90 than that for the first interlayer insulating layer 91 and the fourth conductive layer 78. The additional etching process may be performed until the fourth conductive layers 78 disposed in the uppermost layer of the respective stairs are exposed through the first contact holes H1.

Figure 38:
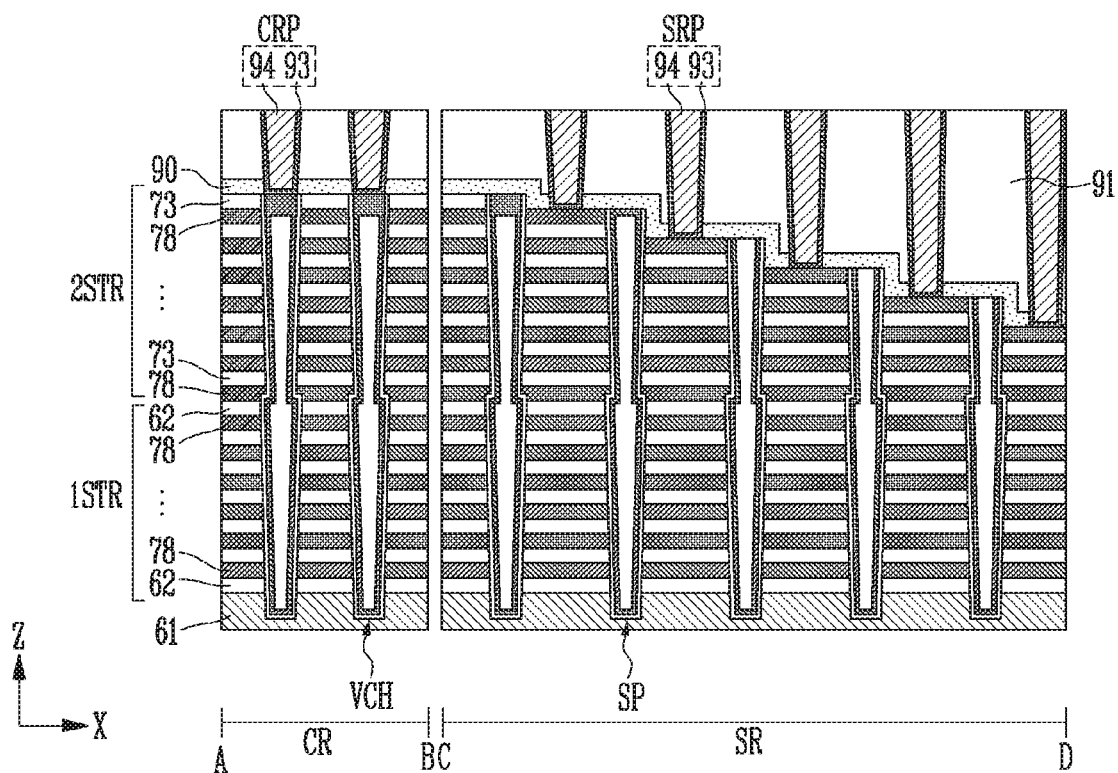

Referring to FIG. 38, a cell contact plug CRP may be formed in each of the first contact holes H1 formed in the cell region CR, and a slimming contact plug SRP may be formed in each of the first contact hole H1 formed in the sliming region SR. The cell contact plugs CRP and the slimming contact plugs SRP may be simultaneously formed. For example, the cell contact plugs CRP and the slimming contact plugs SRP may include a first barrier layer 93 and a second conductive layer 94. For example, after the first barrier 93 is formed along an inner surface of each of the first contact holes H1, the interior of each first contact hole H1 may be filled with the second conductive layer 94. The first barrier layer 93 may be formed of TiN. The second conductive layer 94 may be formed of conductive material such as polysilicon, tungsten, or molybdenum. The cell contact plugs CRP may be formed to abut on the vertical channel structures VCH. The slimming contact plugs SRP may be formed to respectively abut on the fourth conductive layers 78.

The cell contact plugs CRP may electrically couple the vertical channel structures VCH and bit lines to be formed during a subsequent process. During a program, read, or erase operation, the slimming contact plugs SRP may be used to transmit operating voltages (Vop of FIG. 1) generated in the voltage generation circuit (112 of FIG. 1) to the fourth conductive layers 78 which can be used as word lines. After the third conductive layer 98 is formed, a planarization process may be performed to electrically disconnect the cell contact plugs CRP and the second slimming contact plugs 2SRP formed in different regions from each other.

As described above, after the vertical channel structures VCH and the support structures SP are simultaneously formed in the cell region CR and the slimming region SR, a slimming process of forming a stepped structure in the slimming region SR is performed. Hence, a separate process of forming the support structures SP may not be needed. Consequently, a phenomenon in which the memory block is inclined may be prevented by using the support structures SP without performing a separate additional process.

Furthermore, the etching prevention layer 90 is formed in the cell region CR and the slimming region SR before the first contact holes H1 are formed. Hence, during the etching process of forming the first contact holes H1, the fourth conductive layers 78 for word lines may be prevented from being exposed, so that the fourth conductive layers 78 can be protected.

Figure 39:
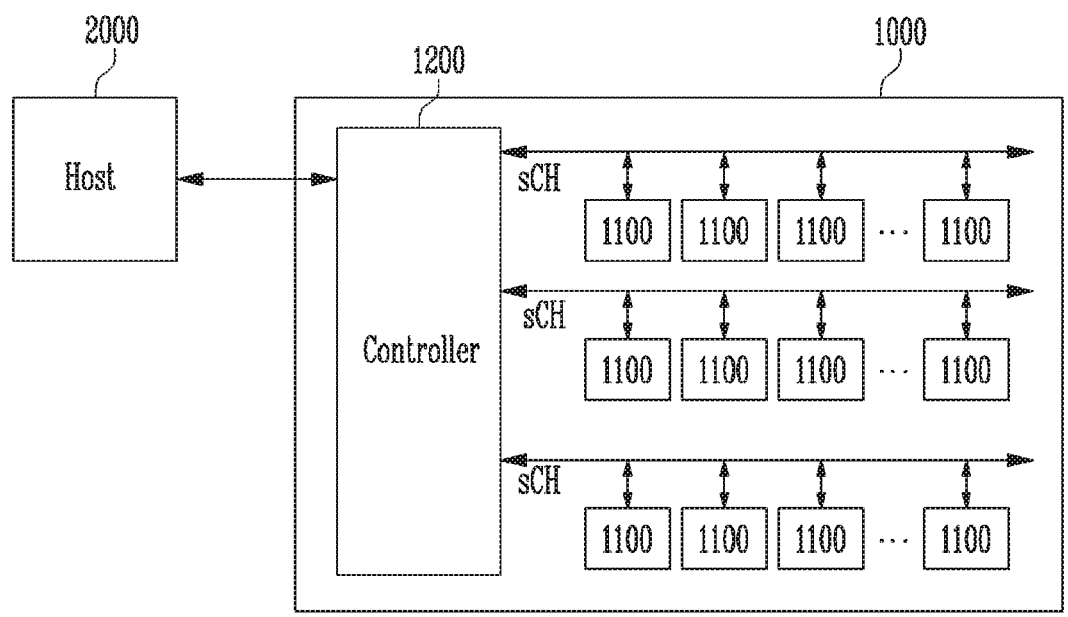
FIG. 39 is a block diagram illustrating an example of a memory system including a memory device in accordance with an embodiment of the present disclosure.

FIG. 39 is a block diagram illustrating an example of a memory system 1000 including a memory device in accordance with an embodiment of the present disclosure.

Referring to FIG. 39, the memory system 1000 may include a plurality of memory devices 1100 configured to store data, and a controller 1200 configured to communicate between the memory devices 1100 and a host 2000.

Each of the memory devices 1100 may be formed as the memory device described in one of the foregoing embodiments.

The memory devices 1100 may be coupled with the controller 1200 through a plurality of system channels sCH. For example, a plurality of memory devices 1100 may be coupled to each system channel sCH. The controller 1200 may be coupled with a plurality of system channels sCH.

The controller 1200 may communicate between the host 2000 and the memory devices 1100. The controller 1200 may control the memory devices 1100 in response to a request from the host 2000, or may perform a background operation for improving the performance of the memory system 1000 even when there is no request from the host 2000.

The host 2000 may generate requests for various operations and output the generated requests to the memory system 1000. For example, the requests may include a program request for controlling a program operation, a read request for controlling a read operation, and an erase request for controlling an erase operation. The host 2000 may communicate with the memory system 1000 through various interfaces such as a peripheral component interconnect express (PCIe) interface, an advanced technology attachment (ATA) interface, a serial ATA (SATA) interface, a parallel ATA (PATA) interface, a serial attached SCSI (SAS) interface, a non-volatile memory express (NVMe) interface, a universal serial bus (USB) interface, a multi-media card (MMC) interface, an enhanced small device interface (ESDI), and an integrated drive electronics (IDE) interface.

Figure 40:
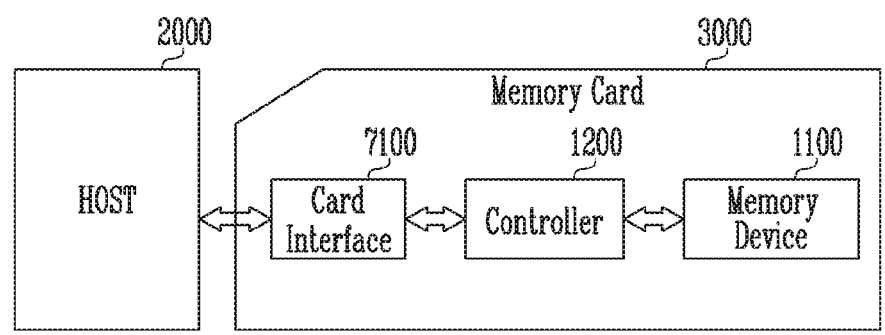
FIG. 40 is a block diagram illustrating an example of a memory system including a memory device in accordance with an embodiment of the present disclosure.

FIG. 40 is a block diagram illustrating an example of a memory system including a memory device in accordance with an embodiment of the present disclosure Referring to FIG. 40, the memory system may be implemented as a memory card 3000. The memory card 3000 may include a memory device 1100, a controller 1200, and a card interface 7100.

The controller 1200 may control data exchange between the memory device 1100 and the card interface 7100. In an embodiment, the card interface 7100 may be a secure digital (SD) card interface or a multi-media card (MMC) interface, but it is not limited thereto.

The card interface 7100 may interface data exchange between the host 2000 and the controller 1200 according to a protocol of the host 2000. In an embodiment, the card interface 7100 may support a universal serial bus (USB) protocol, and an interchip (IC)-USB protocol. Here, the card interface 7100 may refer to hardware capable of supporting a protocol which is used by the host 2000, software installed in the hardware, or a signal transmission method.

When the memory card 3000 is connected to a host interface of the host 2000 such as a PC, a tablet PC, a digital camera, a digital audio player, a cellular phone, console video game hardware or a digital set-top box, the host interface may perform data communication with the memory device 1100 through the card interface 7100 and the controller 1200 under control of a microprocessor of the host 2000.

In various embodiments of the present disclosure, support structures may be formed in a slimming region of a memory block so that the memory block may be prevented from being inclined. The support structures may be formed simultaneously with formation of vertical channel structures, whereby the process of manufacturing the memory device may be facilitated.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory device comprising:
   a stacked structure having a cell region and a slimming region therein and formed by alternately stacking insulating layers and conductive layers;
   vertical channel structures formed to pass through the stacked structure in the cell region;
   support structures formed to pass through the stacked structure in the slimming region, and having different heights depending on a stacked height of the slimming region, each of the support structures having the same structure as each of the vertical channel structures;
   an etching prevention layer formed over the stacked structure and comprising carbon; and
   contact plugs formed to pass through the etching prevention layer and coupled to the conductive layers.

2. The memory device according to claim 1, wherein the etching prevention layer is formed of an SiCN layer.

3. The memory device according to claim 1, wherein the contact plugs comprise:
   cell contact plugs formed in the cell region; and
   slimming contact plugs formed in the slimming region.

4. The memory device according to claim 3, further comprising:
   bit lines formed over the cell contact plugs; and
   metal lines formed over the slimming contact plugs.

5. A method of manufacturing a memory device, comprising:
   alternately stacking insulating layers and conductive layers in a cell region and a slimming region, and forming a stacked structure having a stepped structure in the slimming region;
   forming an etching prevention layer comprising carbon along an upper surface of the stacked structure;
   forming an interlayer insulating layer over the etching prevention layer;
   performing a first etching process of forming contact holes for exposing portions of the etching prevention layer in the cell region and the slimming region of the interlayer insulating layer;
   performing a second etching process of removing the etching prevention layer exposed through the contact holes; and
   forming contact plugs in the contact holes.

6. The method according to claim 5, wherein forming the stacked structure comprises:
   alternately stacking insulating layers and sacrificial layers on a base;
   simultaneously forming vertical channel structures vertically passing through the insulating layers and the sacrificial layers stacked in the cell region, and support structures vertically passing through the insulating layers and the sacrificial layers stacked in the slimming region;
   forming a trench for exposing the sacrificial layers by etching the insulating layers and the sacrificial layers between the support structures in a vertical direction;
   performing a third etching process of removing the sacrificial layers exposed through the trench;
   forming the conductive layers between the insulating layers from which the sacrificial layers are removed; and
   filling an interior of the trench with an insulating layer.

7. The method according to claim 6,
wherein each of the insulating layers and the insulating layer is formed of an oxide layer,
wherein each of the sacrificial layers is formed of an nitride layer, and
wherein the conductive layers are formed of polysilicon, tungsten, or molybdenum.

8. The method according to claim 6, wherein the third etching process comprises a wet etching process.

9. The method according to claim 8, wherein the wet etching process is performed using phosphoric acid as an etchant.

10. The method according to claim 5, wherein the etching prevention layer is formed of an SiCN layer.

11. The method according to claim 5, wherein the interlayer insulating layer is formed of an oxide layer.

12. The method according to claim 5, wherein the etching prevention layer has a thickness of any one of the conductive layers included in the stacked structure.

13. The method according to claim 5, wherein each of the first and the second etching processes comprises an anisotropic etching process.

14. The method according to claim 5, wherein forming the contact plugs comprises:
  forming a barrier layer along an inner surface of each of the contact holes; and
  filling an interior of each of the contact holes provided with the barrier layer with a conductive layer, and forming the contact plugs each comprising the barrier layer and the conductive layer.

15. The method according to claim 14, further comprising, after filling the interior of each of the contact holes with the conductive layer, performing a planarization process such that the contact plugs are electrically disconnected from each other.

16. The method according to claim 5, further comprising:
  forming bit lines over contact plugs formed in the cell region among the contact plugs; and
  forming metal lines over contact plugs formed in the slimming region among the contact plugs.

17. A method of manufacturing a memory device, comprising:
  forming a stacked structure formed by alternately stacking first material layers and second material layers;
  successively forming an etching prevention layer and an interlayer insulating layer over the stacked structure;
  forming a slit region vertically passing through the interlayer insulating layer, the etching prevention layer, the stacked structure;
  performing an etching process of removing the second material layers exposed through the slit region;
  forming third material layers in regions from which the second material layers are removed; and
  forming a fourth material layer in the slit region,
  wherein the etching prevention layer is formed of material having an etch selectivity different from an etch selectivity of the second material layer.

18. The method according to claim 17, wherein each of the first material layers, the interlayer insulating layer, and the fourth material layer is formed of an oxide layer.

19. The method according to claim 17, wherein each of the second material layers is formed of an nitride layer.

20. The method according to claim 17, wherein the etching prevention layer is formed of an SiCN layer.

* * * * *